(12) United States Patent
Iwao et al.

(10) Patent No.: US 8,202,682 B2
(45) Date of Patent: Jun. 19, 2012

(54) METHOD OF MANUFACTURING SEMICONDUCTOR DEVICE, AND RESIST COATING AND DEVELOPING SYSTEM

(75) Inventors: Fumiko Iwao, Nirasaki (JP); Satoru Shimura, Nirasaki (JP); Tetsu Kawasaki, Nirasaki (JP)

(73) Assignee: Tokyo Electron Limited (JP)

( * ) Notice: Subject to any disclaimer, the term of this patent is extended or adjusted under 35 U.S.C. 154(b) by 553 days.

(21) Appl. No.: 12/395,937

(22) Filed: Mar. 2, 2009

(65) Prior Publication Data

US 2009/0220892 A1    Sep. 3, 2009

(30) Foreign Application Priority Data

Feb. 28, 2008  (JP) ................. 2008-048610
Dec. 24, 2008  (JP) ................. 2008-327429

(51) Int. Cl.
*G03F 7/26* (2006.01)
(52) U.S. Cl. ............ 430/312; 430/315; 430/394
(58) Field of Classification Search .............. 430/312, 430/315, 394
See application file for complete search history.

(56) References Cited

U.S. PATENT DOCUMENTS 4,838,991 A * 6/1989 Cote et al. ............ 216/46
2002/0068243 A1 * 6/2002 Hwang et al. ......... 430/312

FOREIGN PATENT DOCUMENTS

| JP | 2001-281886 | 10/2001 |
| JP | 2002-299202 | 10/2002 |
| JP | 2002299202 | * 10/2002 |
| JP | 2003-215814 | 7/2003 |
| JP | 2004062003 | * 2/2004 |

OTHER PUBLICATIONS

First Notice of Rejection Grounds-Chinese Application No. 200910119113.2 issued Mar. 18, 2010.

* cited by examiner

*Primary Examiner* — Kathleen Duda
*Assistant Examiner* — Caleen Sullivan
(74) *Attorney, Agent, or Firm* — Cantor Colburn LLP

(57) ABSTRACT

A method of manufacturing a semiconductor device includes: forming a resist layer on an underlayer, forming an exposed pattern in the resist layer, wherein the exposed pattern comprises a soluble layer and an insoluble layer, forming a resist pattern by removing the soluble layer from the resist layer in which the exposed pattern is formed, removing an intermediate exposed area from the resist pattern, forming a new soluble layer in a surface of the resist pattern from which the intermediate exposed area is removed by applying a reaction material to the resist pattern from which the intermediate exposed area is removed, wherein the reaction material generates a solubilization material that solubilizes the resist pattern, and removing the new soluble layer from the resist pattern.

16 Claims, 28 Drawing Sheets

(A)

(B)

FIG. 1
FORMING RESIST LAYER
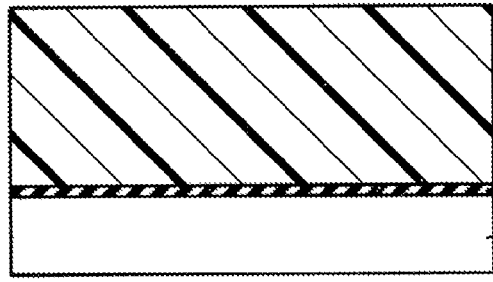
(A)
EXPOSURE
(OPTICAL SYSTEM OMITTED)
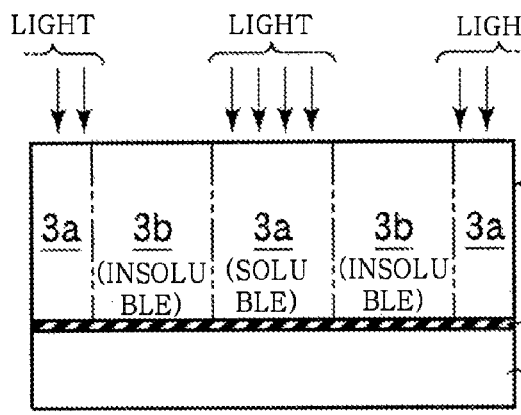
(B)
DEVELOPMENT
(FIRST DEVELOPMENT)
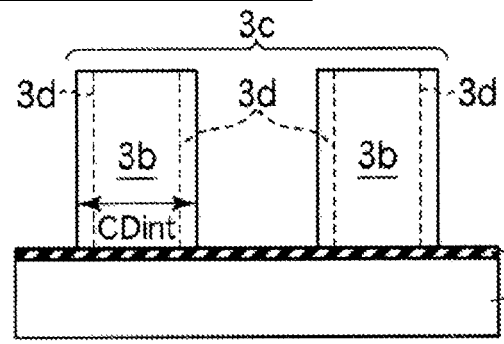
3d ⋯ INTERMEDIATE EXPOSED AREA
(C)
REMOVE INTERMEDIATE EXPOSED AREA
(SECOND DEVELOPMENT)
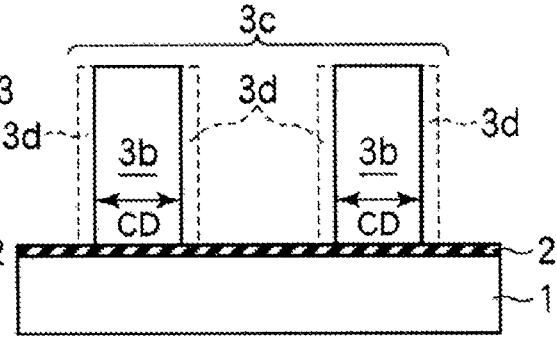
(D)
FORM NEW SOLUBLE LAYER
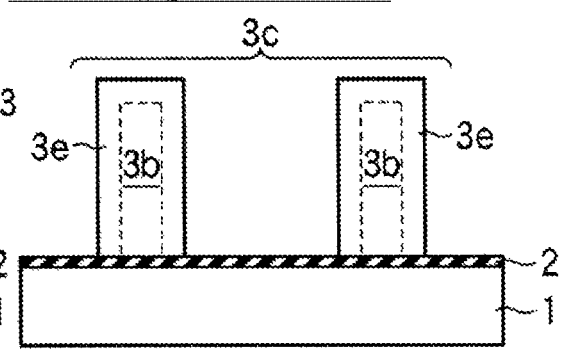
3e ⋯ NEW SOLUBLE LAYER
(E)
REMOVE NEW SOLUBLE LAYER
(THIRD DEVELOPMENT)
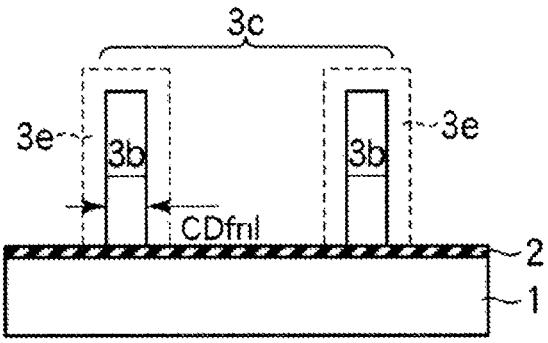
(F)

FIG. 10
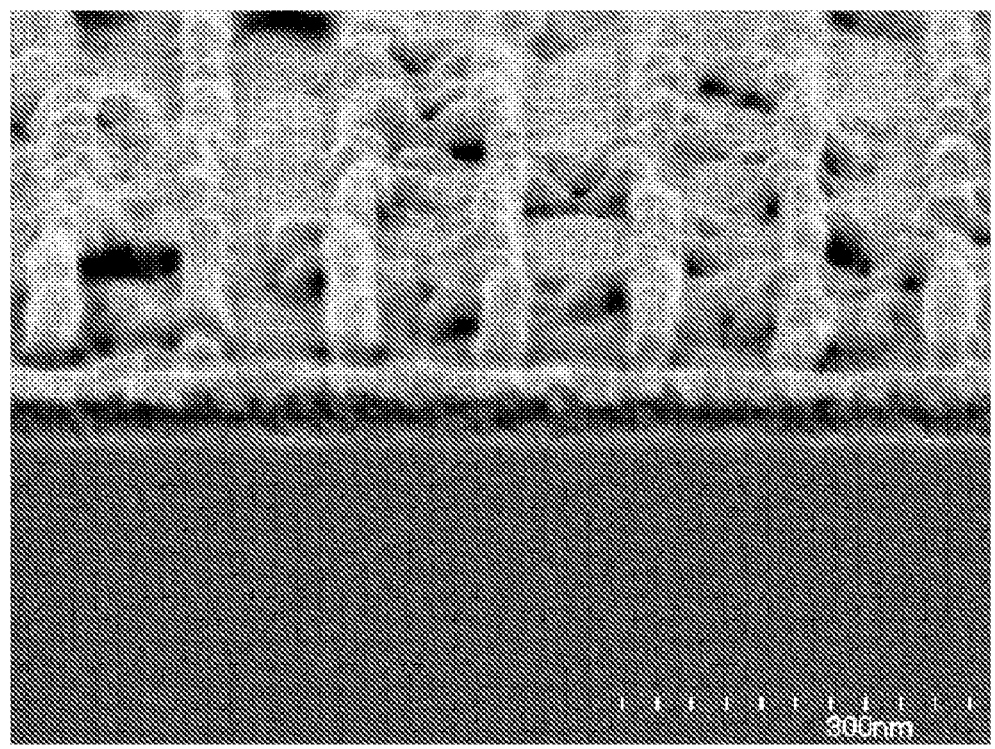
(A)
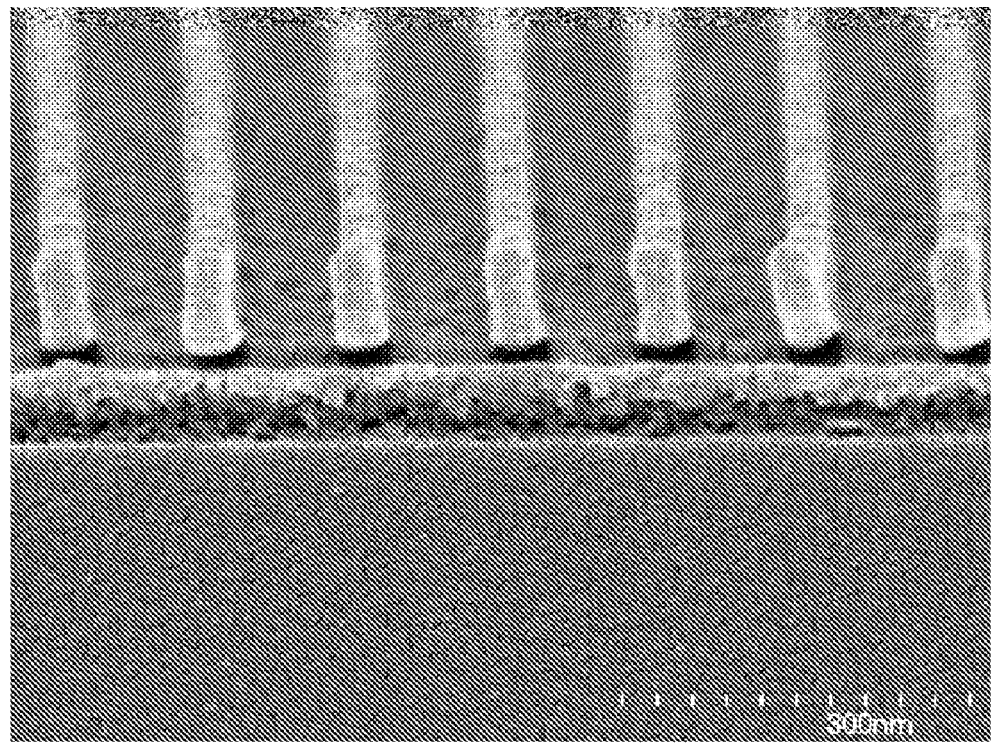
(B)

FIG. 12
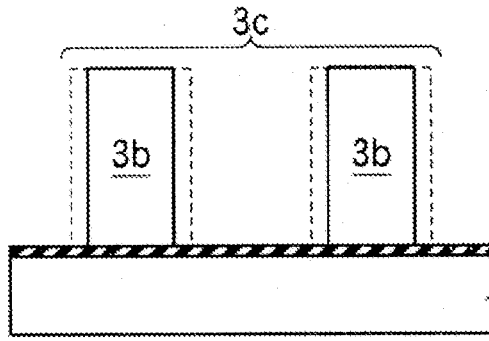
(A) REMOVE INTERMEDIATE EXPOSED AREA (SECOND DEVELOPMENT)
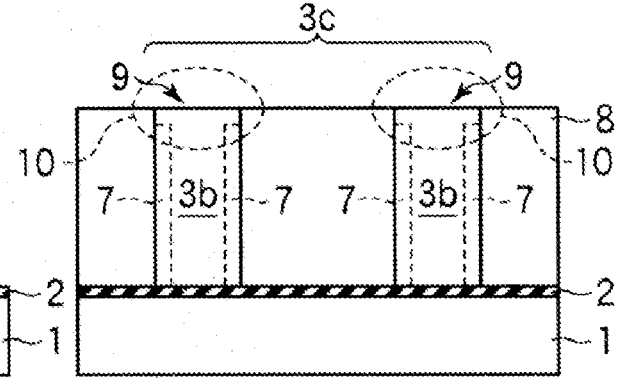
(D) NEUTRALIZE UPPER SURFACE OF RESIST PATTERN
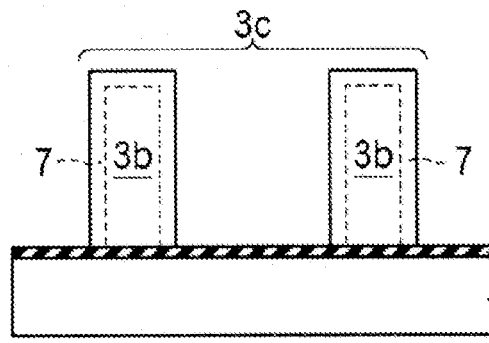
(B) FORM REACTION MATERIAL APPLICATION LAYER
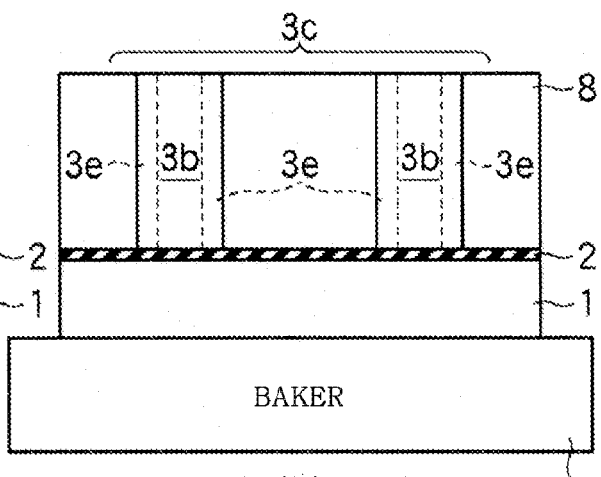
(E) FORM NEW SOLUBLE LAYER
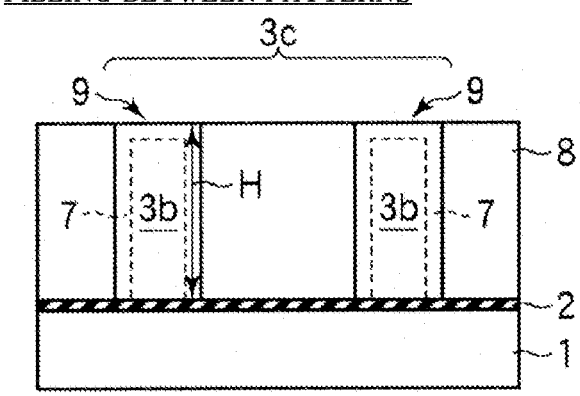
(C) FILLING BETWEEN PATTERNS FIG. 15
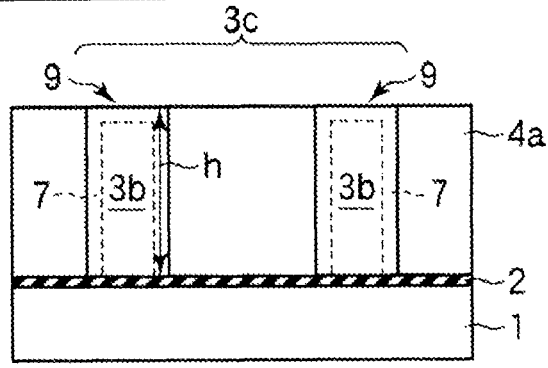
(A)
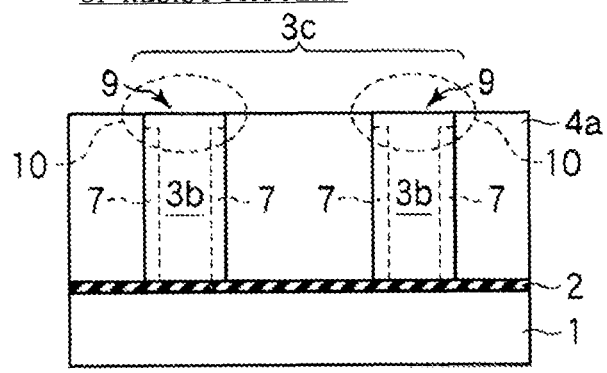
(B)
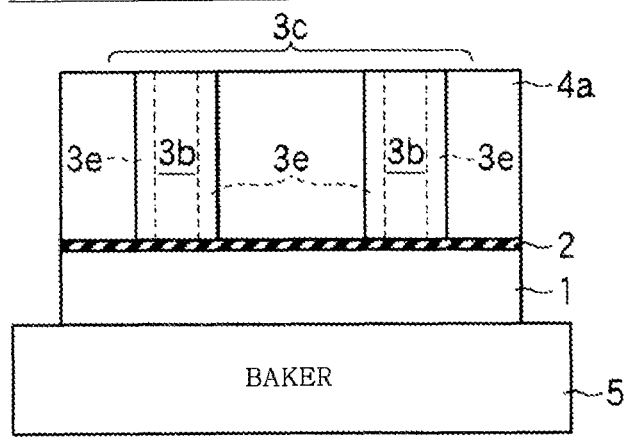
(C)

(OPTICAL SYSTEM OMITTED)

FIG. 38
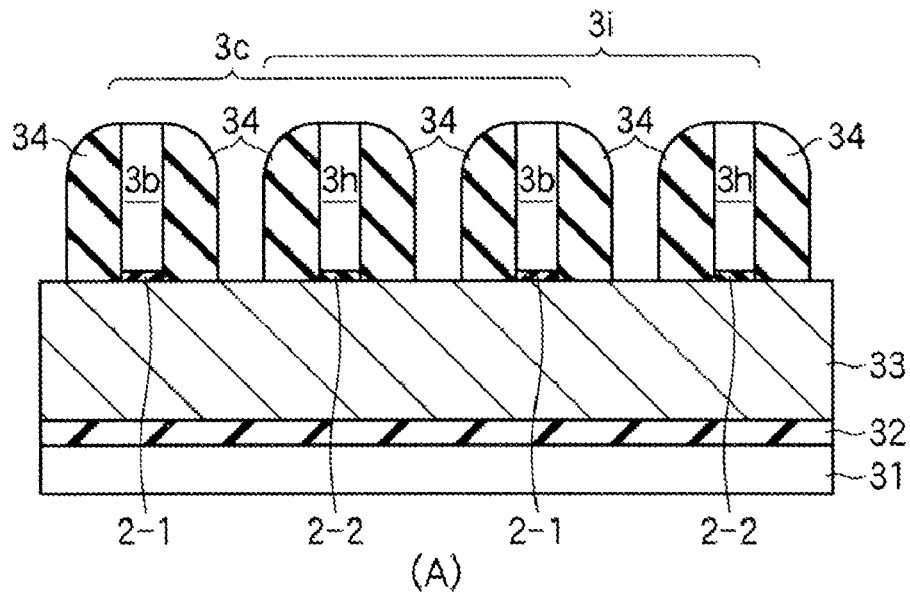
(A)
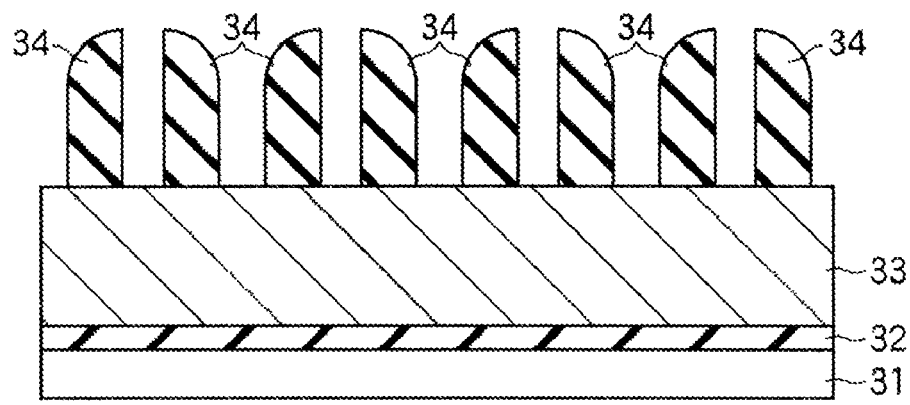
(B)
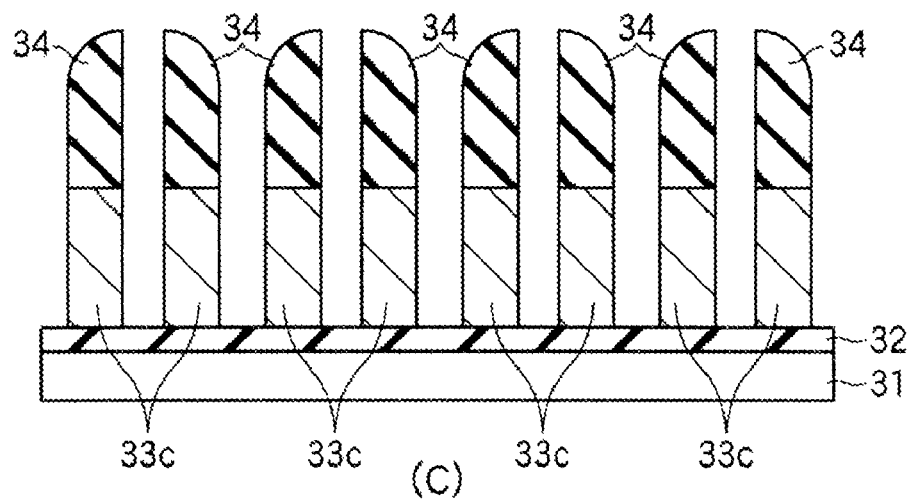
(C)

METHOD OF MANUFACTURING SEMICONDUCTOR DEVICE, AND RESIST COATING AND DEVELOPING SYSTEM

CROSS-REFERENCE TO RELATED PATENT APPLICATIONS

This application claims the benefit of Japanese Patent Application No. 2008-048610 filed on Feb. 28, 2008 and Japanese Patent Application No. 2008-327429 filed on Dec. 24, 2008, in the Japanese Patent Office, the disclosure of which is incorporated herein in its entirety by reference.

BACKGROUND OF THE INVENTION

1. Field of the Invention

The present invention relates to a method of slimming a resist pattern used for a semiconductor process, a method of manufacturing a semiconductor device using the method of slimming, and a resist coating and developing system.

2. Description of the Related Art

With the miniaturization of semiconductor devices, it has been difficult to sufficiently secure an exposure contrast of 1:1 for a dense pattern using optical exposure technology only. To overcome this problem, methods of 1) combining a new layer with a pattern to form a dense pattern and 2) forming a pattern in a two-stage process to form a dense pattern have recently been considered.

It is important how thinly the line width of a pattern can be formed in any of the above-described methods.

Patent documents 1-3 below, for example, disclose techniques of forming a resist pattern with a thin line width.

Patent document 1: Japanese Unexamined Patent Publication No. 2001-281886;

Patent document 2: Japanese Unexamined Patent Publication No. 2002-299202; and

Patent document 3: Japanese Unexamined Patent Publication No. 2003-215814.

In Patent document 1, a resist pattern is formed using chemically amplified resist. An acid layer is coated on the resist pattern and the surface portion of the resist pattern is changed to be alkali soluble. By removing the alkali soluble surface portion, the line width of the resist pattern may be further decreased, compared to the original line width.

In Patent document 2, a resist pattern is formed using chemically amplified resist. A reforming member is coated on the resist pattern to be dispersed in the resist pattern. Then, the reforming member and a portion of the resist pattern that becomes soluble as the reforming member is dispersed are removed. Thus, the line width of the resist pattern may be further decreased, compared to the original line width.

In Patent document 3, after a resist pattern is formed, a pattern thin-wall material (a reducing material) is coated on the resist pattern so that a pattern mixing layer is formed on the surface of the resist pattern. Then, the pattern thin-wall material and the pattern mixing layer are removed so that the line width of the resist pattern may be further decreased, compared to the original line width.

In Patent documents 1-3, by solubilizing the surface of the resist pattern, the line width of the resist pattern may be further decreased, compared to the original line width (hereinafter, in the specification, referred to as slimming).

However, demand for pattern miniaturization has been continuously high and accordingly the line width needed for the pattern has decreased. Also, the sensitivity of the resist itself has increased to form a finer pattern. When a process to solubilize the surface of the resist pattern is added in order to slim the resist pattern, the pattern is likely to be easily collapsed due to the above-described various factors.

SUMMARY OF THE INVENTION

The present invention provides a method of slimming a resist pattern without collapsing the resist pattern, a method of manufacturing a semiconductor device using the method of slimming, and a resist coating and developing system for performing the method of slimming.

According to a first aspect of the present invention, a method of manufacturing a semiconductor device comprises: forming a resist layer on an underlayer, forming an exposed pattern in the resist layer, wherein the exposed pattern comprises a soluble layer and an insoluble layer, forming a resist pattern by removing the soluble layer from the resist layer after the exposed pattern is formed, removing an intermediate exposed area from the resist pattern, applying a reaction material to the resist pattern after the intermediate exposed area is removed, the reaction material generating a solubilization material that solubilizes the resist pattern, forming a new soluble layer in a surface of the resist pattern where the reaction material is applied, and removing the new soluble layer from the resist pattern.

According to a second aspect of the present invention, a method of manufacturing a semiconductor device comprises: forming a first resist layer on an underlayer, forming an exposed pattern in the first resist layer, wherein the exposed pattern comprises a soluble layer and an insoluble layer, forming a first resist pattern by removing the soluble layer from the first resist layer where the exposed pattern is formed, removing an intermediate exposed area from the first resist pattern, applying a reaction material to the first resist pattern after the intermediate exposed area is removed, wherein the reaction material generates a solubilization material that solubilizes the first resist pattern, forming a new soluble layer in a surface of the first resist pattern where the reaction material is applied, removing the new soluble layer from the first resist pattern, forming a second resist layer on the underlayer on which the first resist pattern after the new soluble layer is removed is formed, forming an exposed pattern in the second resist layer, wherein the exposed pattern comprises a soluble layer and an insoluble layer, forming a second resist pattern by removing the soluble layer from the second resist layer where the exposed pattern is formed, removing an intermediate exposed area from the second resist pattern, applying a reaction material to the second resist pattern after the intermediate exposed area is removed, wherein the reaction material generates a solubilization material that solubilizes the second resist pattern, forming a new soluble layer in a surface of the second resist pattern where the reaction material is applied, and removing the new soluble layer from the second resist pattern.

According to a third aspect of the present invention, a resist coating and developing system comprises: a coating unit for coating resist, a pre-bake unit for pre-baking the coated resist, an exposure unit for exposing the pre-baked resist, a first post exposure bake unit for post-exposure baking the exposed resist, a first development unit for developing the post-exposure baked resist, a post-bake unit for post-baking the developed resist, a second development unit for developing the post-baked developed resist, a reaction material application unit for applying a reaction material to the second developed resist, wherein the reaction material generates a solubilization material that solubilizes the second developed resist, a second post-exposure bake unit for post-exposure baking the resist into which the reaction material is applied, and a third development unit for developing the second post-exposed baked resist.

BRIEF DESCRIPTION OF THE DRAWINGS

The above and other features and advantages of the present invention will become more apparent by describing in detail exemplary embodiments thereof with reference to the attached drawings in which:

FIGS. 1(A)-1(F) are cross-sectional views illustrating a method of slimming a resist pattern, according to a first embodiment of the present invention;

FIG. 10(A) is a SEM image showing an example of a resist pattern formed using a slimming method according to a reference example;

FIG. 10(B) is a SEM image showing an example of a resist pattern formed using the slimming method according to the first embodiment;

FIGS. 12(A)-12(E) are cross-sectional views illustrating a method of slimming a resist pattern, according to a second embodiment of the present invention;

FIGS. 15(A)-15(C) are cross-sectional views illustrating an another example of a method of slimming a resist pattern, according to the second embodiment of the present invention;

FIGS. 38(A)-38(C) are cross-sectional views illustrating an another example of a method of manufacturing a semiconductor device, according to the fourth embodiment of the present invention;

DETAILED DESCRIPTION OF THE INVENTION

Figure 2:
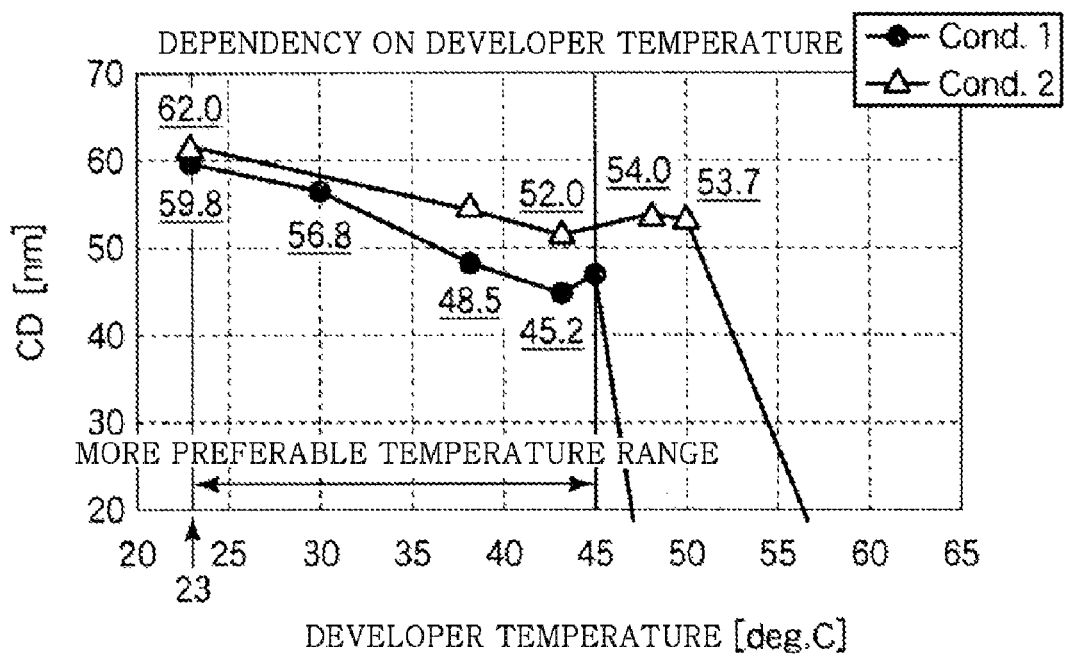
FIGS. 2 and 3 are graphs showing the relationship between the line width (CD) and the temperature of a developer.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

First Embodiment

FIGS. 1(A)-1(F) are cross-sectional views illustrating an example of a method of slimming a resist pattern, according to a first embodiment of the present invention.

Referring to FIG. 1(A), a bottom anti-reflection coating (BARC) 2 is formed on an underlayer 1. The underlayer 1 may be semiconductor wafer itself or a structure in a semiconductor device such as an interlayer insulation film formed on the semiconductor wafer. The BARC 2 may be formed by coating resist to which an anti-reflection agent is added or by depositing an anti-reflection material. Also, the BARC 2 may be formed when necessary. Next, a resist layer 3 is formed by coating resist on the BARC 2 and evaporating and solidifying a solvent by pre-baking the coated resist. The resist may be chemically amplified resist. For example, the chemically amplified resist may be resist for generating a solubilization material that is soluble to a solvent as light is incident thereon. In detail, a chemically amplified resist including a photoacid generator (PAG) and capable of responding to light exposure using ArF excimer laser having a 193 nm wavelength as a light source is used in the present first embodiment. The PAG generates acid when exposed to light. The acid reacts to an alkali insoluble protecting group included in the resist and changes the alkali insoluble protecting group to an alkali soluble group (a solubilization material). An example of the reaction is an acid catalyst reaction.

Referring to FIG. 1(B), a selected portion of the resist layer 3 is exposed to light so that a solubilization material that solubilizes the resist layer 3 may be generated. In the present embodiment, the resist may be a chemically amplified resist including the PAG. In the present embodiment, after the exposure to light, a post exposure bake (PEB) process is performed to facilitate the change of the alkali insoluble protecting group to an alkali soluble group (a solubilization material), by activating the acid generated from the resist layer 3. As above, by selectively generating a solubilization material, an exposed pattern formed of, for example, a soluble layer 3a that is soluble to an alkali agent and an insoluble layer 3b that is insoluble to the alkali agent may be obtained from the resist layer 3.

Referring to FIG. 1(C), a resist pattern 3c according to the exposed pattern is formed by removing the soluble layer 3a from the resist layer 3 where the exposed pattern is formed. In the present embodiment, the soluble layer 3a is removed by spraying an alkali solvent (a developer) on the resist layer 3 where the exposed pattern is formed. Accordingly, the resist pattern 3c formed of the insoluble layer 3b is formed. If necessary, a post-bake process is performed to harden the resist pattern 3c. As a result, a first development process is completed.

Conventionally, the development process of the resist layer 3 is performed once. However, an area having an intermediate solubility characteristic between the state of the soluble layer 3a and the state of the insoluble layer 3b may be generated at the side portion of the resist layer 3 after the development because the area is not completely solubilized when the area should be soluble, or the area is slightly soluble when the area should be insoluble. The area is referred to as an intermediate exposed area 3d in the present specification. The intermediate exposed area 3d is generated for a variety of reasons. For example, as semiconductor device miniaturization continues, it is difficult to obtain a sufficient exposure contrast at a boundary between an area that must be exposed to light and an area that must not be exposed to light. With the development of miniaturization, the wavelength for exposure is shortened so that KrF excimer laser or ArF excimer laser having short wavelengths may be presently used as a light source. However, the short wavelength light source, such as excimer laser, has a problem in that the exposure strength is easily decreased, for example, compared to exposure using an i-ray of a mercury lamp. This is one of a plurality of factors that make it difficult to obtain sufficient exposure contrast in the manufacture of miniature semiconductor devices.

Also, a change in the brightness from a bright portion to a dark portion is substantially a continuous one, not one that is discontinuous and discrete, in microcosm. Accordingly, a portion on which a small amount of light is incident is generated in the resist layer 3. For example, the chemically amplified resist used as a short wavelength light source such as excimer laser entirely includes the PAG. Since the PAG is entirely included in the chemically amplified resist, a small amount of acid is generated, even if a small quantity of light is incident on the chemically amplified resist. The small amount of generated acid generates the intermediate exposed area 3d in the resist pattern 3c after the development. The generation of the intermediate exposed area 3d has an adverse influence on the slimming of resist later.

In the present embodiment, as illustrated in FIG. 1(D), the intermediate exposed area 3d is removed from the resist pattern 3c after the first development process.

An example of a technique of removing the intermediate exposed area 3d is development. In the present embodiment, development is used to remove the intermediate exposed area 3d (a second development process).

When development is used for the removal of the intermediate exposed area 3d, the relationship between a line width (critical dimension: CD) of the resist pattern 3c and the temperature of a developer is shown in FIG. 2. FIG. 2 is a graph showing a change in the line width (CD) according to the temperature of a developer when the second development process is performed with respect to the resist pattern 3c having a line width (CD) of about 60 nm. In this test, the concentration of a developer is a standard concentration of about 2.38% and a development time is 60 seconds (Condition 1) and 30 seconds (Condition 2).

Referring to FIG. 2, the line width (CD) decreases as the temperature of the developer increases.

Further, the amount of decrease of the line width (CD) increases as the temperature of the developer increases. In the present test, when the development time is 60 seconds and the temperature of the developer is within a range of 40° C.-45° C., the amount of decrease of the line width (CD) is about 15 nm that is the maximum decrease amount. Also, when development time is 30 seconds and the temperature of the developer is within a range of 40° C.-50° C., the amount of decrease of the line width (CD) is about 6-8 nm that is the maximum decrease amount.

Although a tendency that the amount of decrease of the line width (CD) increases by increasing the temperature of a developer is confirmed as above, the intermediate exposed area 3d is generated in the insoluble layer 3b at a certain rate, not in the resist pattern 3c, that is, in the entire portion of the insoluble layer 3b. Also, since the insoluble layer 3b theoretically does not dissolve in a developer, if the intermediate exposed area 3d that is removable according to the development time is removed, the decrease in the line width (CD) may be discontinued.

According to the test result of FIG. 2, for the development time of 60 seconds, the line width (CD) is not reduced any more when the amount of decrease of the line width (CD) is about 10-15 nm. Likewise, for the development time of 30 seconds, the line width (CD) is not reduced any more when the amount of decrease of the line width (CD) is about 6-8 nm. From the result, it is assumed that, in the resist pattern 3c having the original line width of about 60 nm, the intermediate exposed area 3d that is removable within the development time of 60 seconds has a width of about 10-15 nm and the intermediate exposed area 3d that is removable within the development time of 30 seconds has a width of about 6-8 nm. In calculation of the rate, the intermediate exposed area 3d that is removable according to the development time is assumed to be about 10-25% of the original line width.

After the intermediate exposed area 3d that is removable is removed according to the development time, the insoluble layer 3b that is difficult to remove remains. Since the insoluble layer 3b theoretically does not dissolve in a developer, when the original line width is reduced by 10-25%, the line width does not theoretically dissolve any further. That is, even if the temperature of the developer is increased, an effect of removing the intermediate exposed area 3d is hardly changed over a certain temperature. Thus, it is desirable that an appropriate upper limit is set for the temperature of the developer. By setting an appropriate upper limit, for example, there is no need to unnecessarily heat the developer and thus manufacturing costs may be decreased. In the present embodiment, when the temperature of the developer exceeds a temperature of about 43° C., the removal effect does not change any more. As a result, although the range of the temperature of the developer varies according to the development time, the range of the temperature of the developer may be preferably about 23° C.-45° C.

However, in the present embodiment, when the temperature of the developer exceeds a range of 45° C.-50° C., the measurement of the line width (CD) is impossible because the resist pattern 3c is collapsed. Since the resist pattern 3c, that is, the insoluble layer 3b, is not dissolved in the developer, it is not likely that the resist pattern 3c is collapsed as the resist pattern 3c becomes too narrow due to the developer. The collapse of the resist pattern 3c is because the BARC 2 formed under the resist pattern 3c is eroded by the developer. In other words, the resist pattern 3c is collapsed as the BARC 2 that is the base of the resist pattern 3c is eroded.

Accordingly, the same test is performed by changing the line width (CD) of the resist pattern 3c to about 70 nm. In the test, the concentration of a developer is a standard concentration of about 2.38% and the development time is 10 seconds. A result of the test is shown in FIG. 3.

Figure 3:
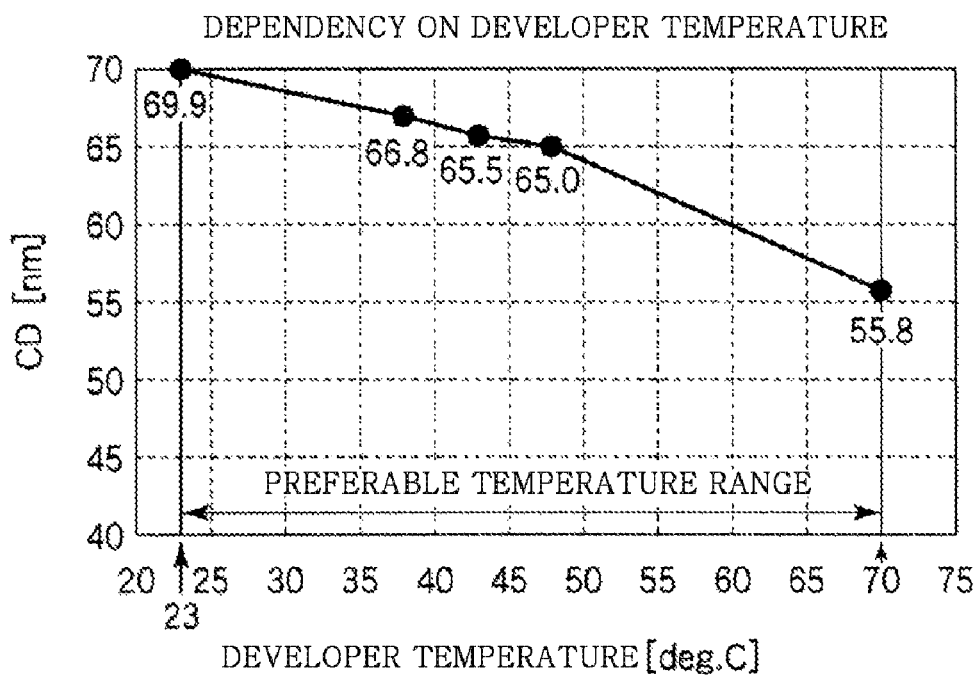

Referring to FIG. 3, when the line width (CD) of the resist pattern 3c is about 70 nm, the line width (CD) of the resist pattern 3c may be decreased, without the collapse of the resist pattern 3c, until the temperature of the developer reaches 70° C.

As a result, it can be seen that a preferable temperature range of the developer is in a range of 23° C.-70° C.

However, considering the tolerance of the BARC 2, it is desirable that the range of the temperature of the developer is 23° C.-45° C.

Thus, when the development is used to remove the intermediate exposed area 3d, the setting of the upper limit in the temperature of the developer is advantageous not only for the lowering the manufacturing costs but also for the reduction of the collapse of the resist pattern 3c due to the unexpected erosion of the BARC 2.

Figure 4:
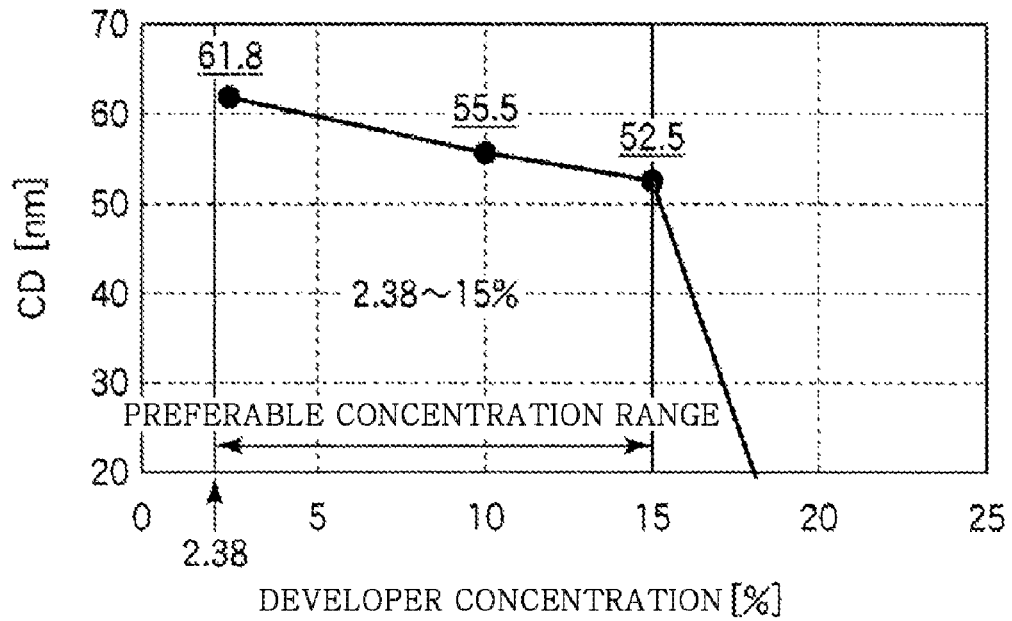
FIG. 4 is a graph showing the relationship between the line width (CD) and the concentration of a developer.

Next, when the development is used for the removal of the intermediate exposed area 3d, the relationship between the line width (CD) and the concentration of the developer is shown in FIG. 4. FIG. 4 is a graph showing a change in the line width (CD) according to the concentration of the developer when the second development process is performed with respect to the resist pattern 3c having a line width (CD) of about 60 nm. In this test, the temperature of the developer used for the second development process is 23° C. and the development time is 60 seconds.

Referring to FIG. 4, the decrease in the line width (CD) for a unit time period, that is, 60 seconds in the present embodiment, increases as the concentration of the developer increases. In the present embodiment, as the concentration of the developer is increased to 2.38%, 10%, and 15%, the amount of a decrease in the line width (CD) increases accordingly.

In the present embodiment, as the concentration of the developer increases over 15%, close to 20%, the collapse of the resist pattern 3c begins. As described above, the reason for the collapse is the erosion of the BARC 2.

As described above, in order to remove the intermediate exposed area 3d, it is efficient to increase the concentration of the developer. However, considering the limit in the effect of the removal of the intermediate exposed area 3d and the erosion of the BARC 2, it is preferable to set an upper limit in the concentration of the developer. In the present embodiment, the preferable concentration of the developer is in a range of about 2.38%-15%.

Figure 5:
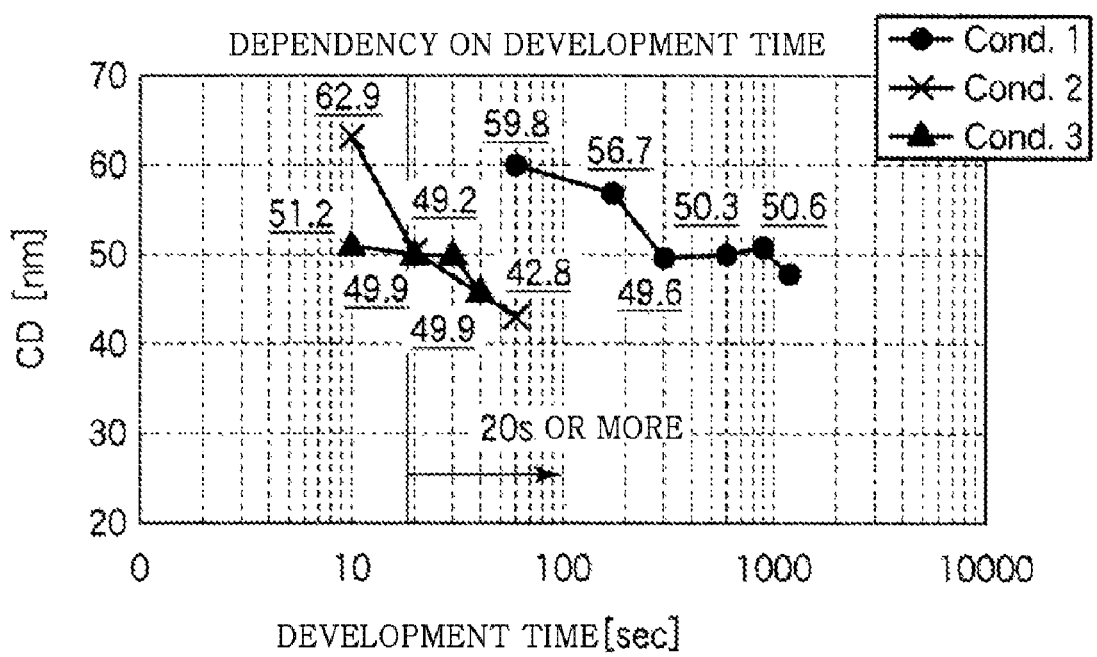
FIGS. 5, 6, and 7 are graphs showing the relationship between the line width (CD) and the development time.

Also, when the development is used for the removal of the intermediate exposed area 3d, the relationship between the line width (CD) and the development time is shown in FIG. 5. FIG. 5 is a graph showing a change in the line width (CD) according to the development time when the second development process is performed with respect to the resist pattern 3c having a line width (CD) of about 60 nm. In this test, the concentration of the developer is selected from the three concentrations of 2.38% (the standard concentration), 5%, and 10%. The temperature of the developer is set to 23° C. (Condition 1), 35° C. (Condition 2), and 35° C. (Condition 3), respectively, for the concentrations of 2.38%, 5%, and 10%.

Referring to FIG. 5, the line width (CD) decreases as the development time increases.

For example, for the condition 1, when the development time is over about 60 seconds, the line width (CD) begins to decrease. For the conditions 2 and 3, when the development time is over about 20 seconds, the effect of decrease in the line width (CD) is high.

Also, since the intermediate exposed area 3d is included in the resist pattern 3c at the rate at which the intermediate exposed area 3d is initially included in the resist pattern 3c, even if the development time is extended, the effect of removal is hardly changed after a predetermined time. In the present embodiment, the removal effect does not change after 300 seconds.

Figure 6:
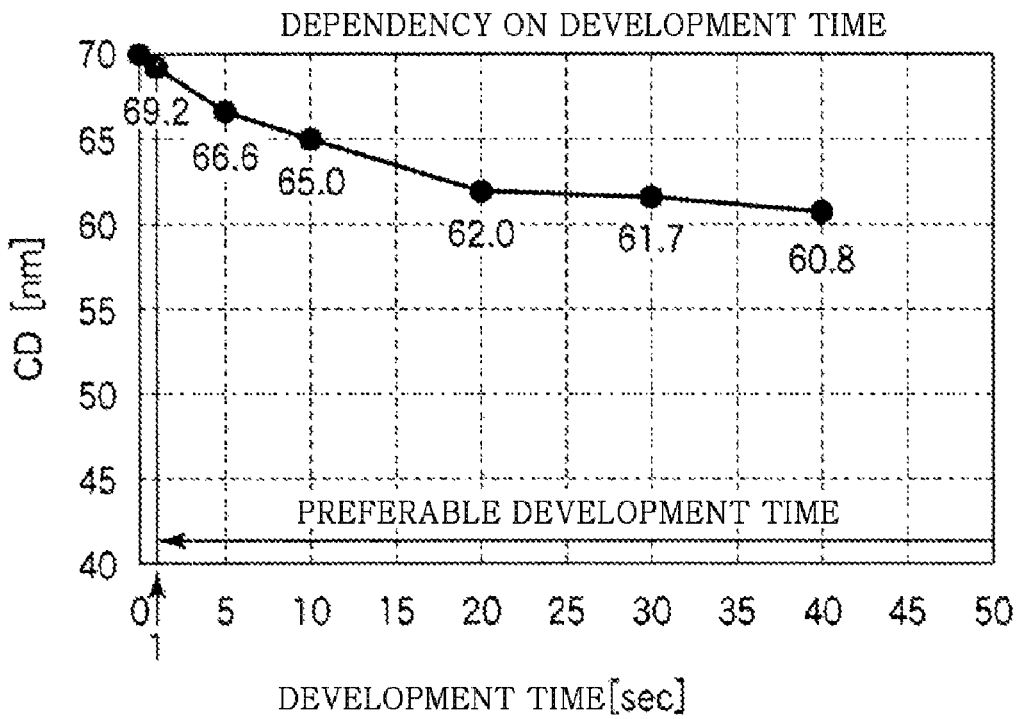

FIG. 6 is a graph showing a change in the line width (CD) when the development time is less than 20 seconds. In the test, the concentration of the developer is 2.38% and the temperature of the developer is 48° C.

Referring to FIG. 6, the line width (CD) begins to decrease when the development time is 1 second.

Figure 7:
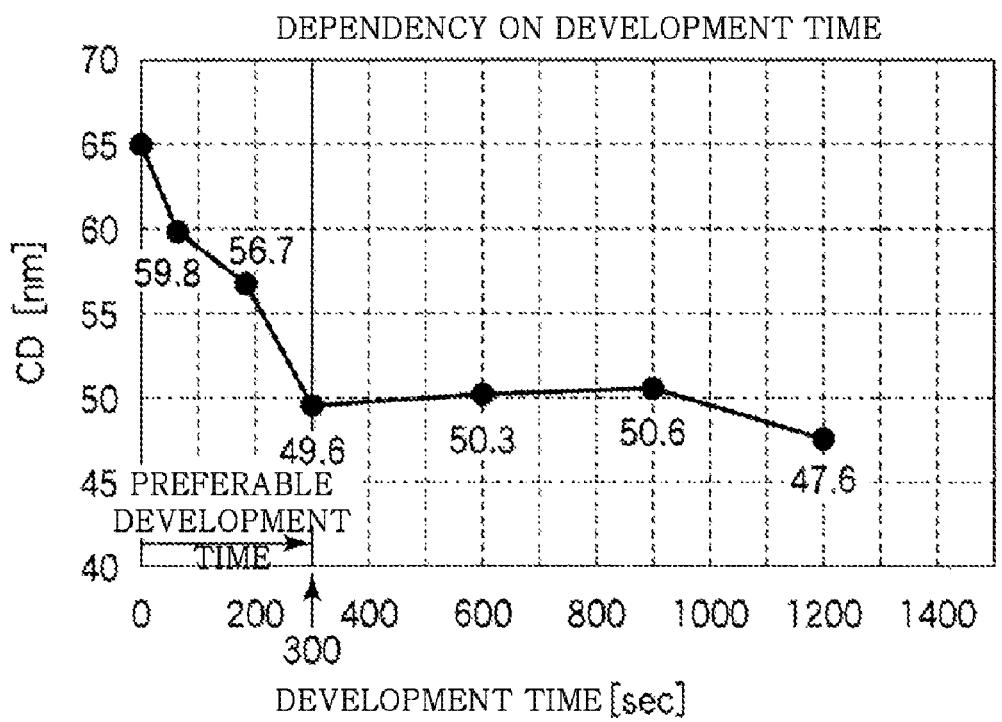

FIG. 7 is a graph showing, without a logarithmic expression, a change in the line width (CD) from the development time of 0 seconds to 1200 seconds based on the result of the test of the sample of the condition 1 of FIG. 5.

Referring to FIG. 7, when the development time is over 300 seconds, the removal effect is hardly changed.

In consideration of the above results, in the present embodiment, a preferable development time is 1-300 seconds.

In the present embodiment, as shown in FIG. 1(E), a reaction material generating a solubilization material that solubilizes the resist pattern 3c from which the intermediate exposed area 3d is removed is applied to the resist pattern 3c so that a new soluble layer 3e may be formed in the surface of the resist pattern 3c from which the intermediate exposed area 3d is removed. An example of a method of forming the new soluble layer 3e is to disperse the reaction material in the resist pattern 3c. The following two examples may be used for the dispersion.

Figure 8:
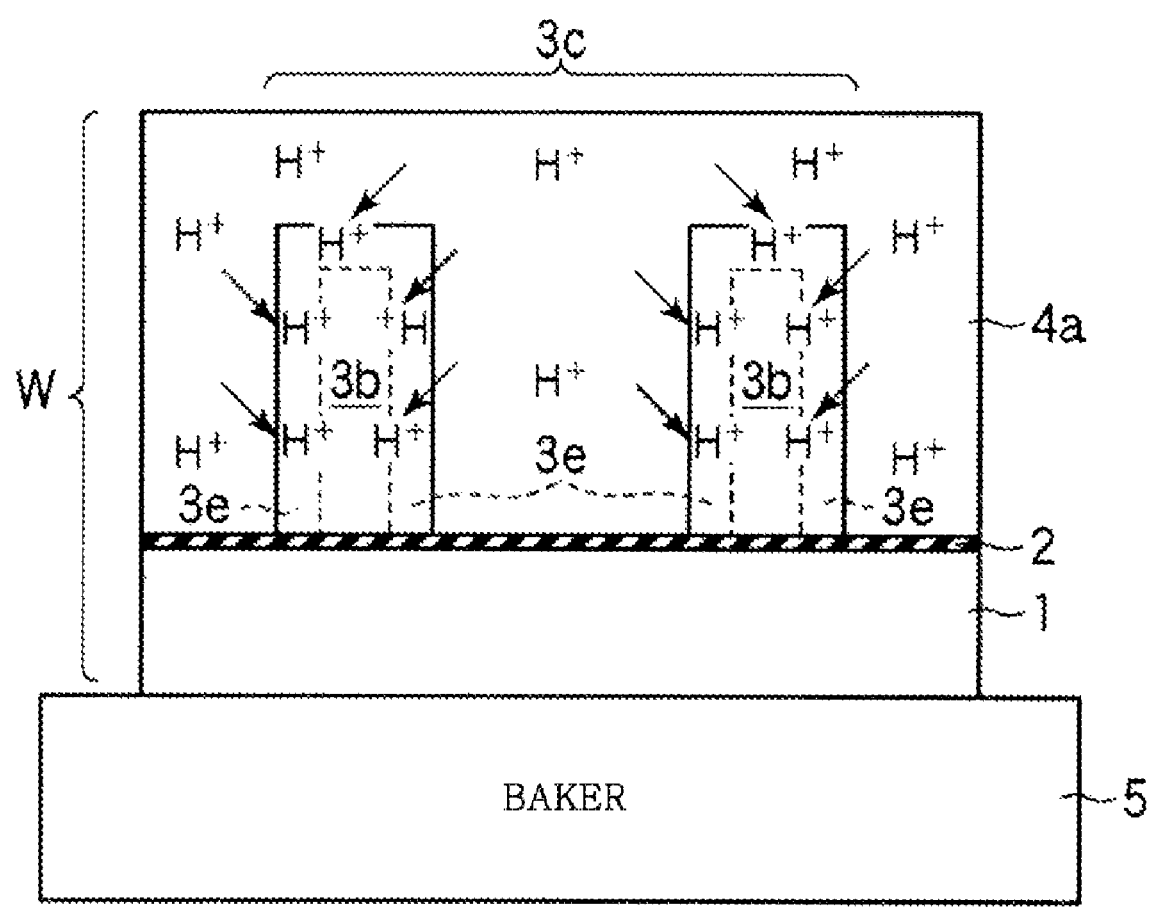
FIG. 8 is a cross-sectional view for explaining a first dispersion example in which a reaction material is dispersed in a resist pattern.

In a first example, a reaction material is dispersed in the resist pattern 3c in a liquid state. An example of a liquid state dispersion, as illustrated in FIG. 8, is coating of a solution including the reaction material on the resist pattern 3c from which the intermediate exposed area 3d is removed. An example of the reaction material is acid. As an example of an acid solution including acid, for example, top anti-reflection coating (TARC) may be used.

In an example of a detailed process, as illustrated in FIG. 8, a solution 4a including a reaction material, for example, acid ($H^+$), is coated on the resist pattern 3c from which the intermediate exposed area 3d is removed. The acid $H^+$ of the solution 4a is dispersed from the surface of the resist pattern 3c to the inside of the resist pattern 3c. During the dispersion, as illustrated in FIG. 8, when a substrate, for example, a semiconductor wafer W, where the resist pattern 3c is formed, is baked using a baker 5, the amount of dispersion of the reaction material, for example, the acid $H^+$, may be increased greatly. Also, the baking of the substrate may activate the acid $H^+$ dispersed in the resist pattern 3c, thus facilitating the change from the insoluble layer 3b to the new soluble layer 3e. An example of the change from the insoluble layer 3b to the new soluble layer 3e is, for example, a change from an alkali insoluble protecting group to an alkali soluble group (a solubilization material) using the acid $H^+$ as a catalyst component.

When the baking temperature is too high, the pattern may be broken or collapsed. Therefore, it is desirable that an upper limit for the baking temperature is set. Although the upper limit of the baking temperature may vary according to the type of resist forming the resist pattern 3c, in the present embodiment, the upper limit is 110° C., preferably, 50° C.-180° C.

Figure 9:
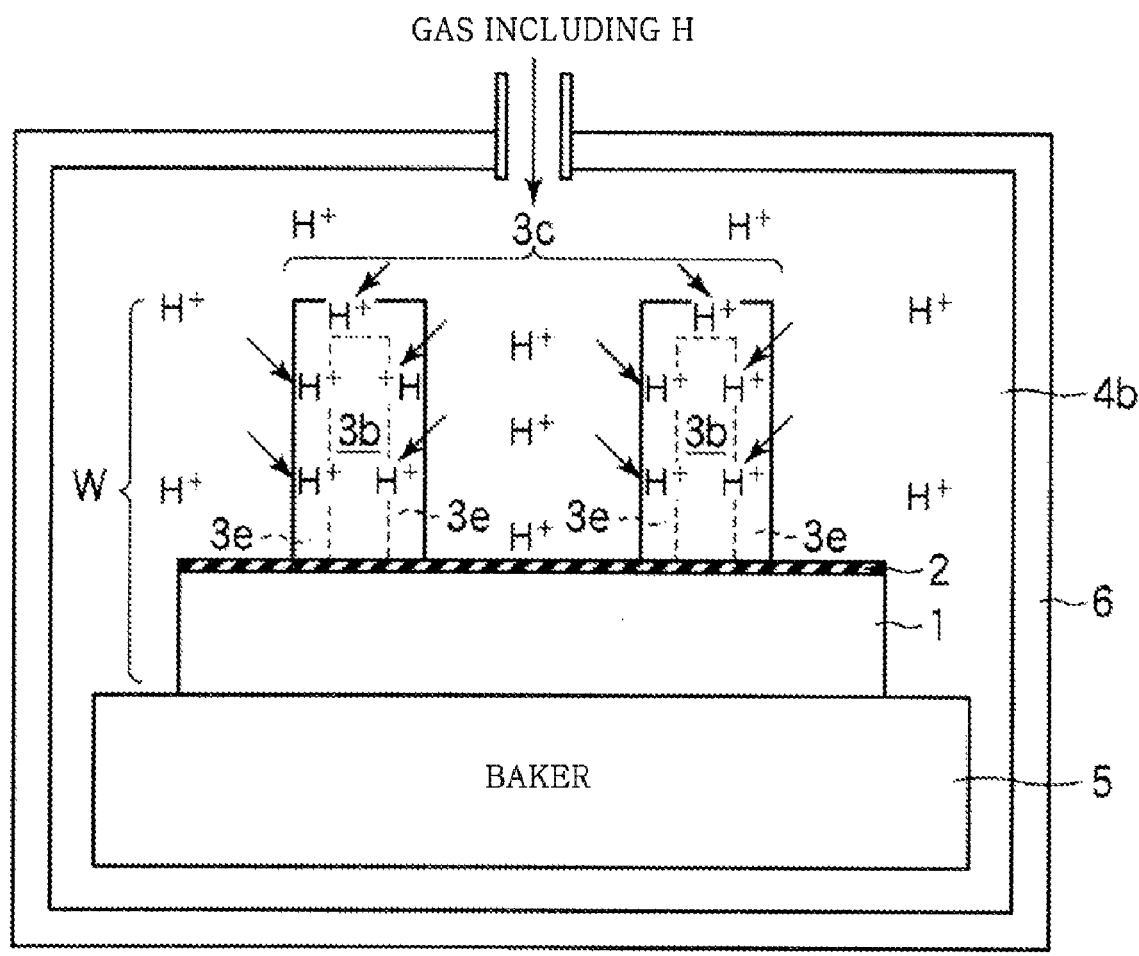
FIG. 9 is a cross-sectional view for explaining a second dispersion example in which a reaction material is dispersed in a resist pattern.

In a second example, a reaction material is dispersed in the resist pattern 3c in a gas state. Referring to FIG. 9, an example of a gas state dispersion is exposure of the resist pattern 3c from which the intermediate exposed area 3d is removed, to a gas (atmosphere) including the reaction material. An example of the reaction material is acid as in the first example. As an example of the gas including acid, for example, a gas obtained by evaporating the TARC may be used.

In an example of a detailed process, as illustrated in FIG. 9, a substrate, for example, a semiconductor wafer W, where the resist pattern 3C from which the intermediate exposed area 3d is removed is formed, is put into a process chamber 6. An acid including gas including the reaction material, acid $H^+$, is supplied to the process chamber 6 so that the resist pattern 3c is exposed to an atmosphere 4b including the acid $H^+$. The acid $H^+$ of the atmosphere 4b is dispersed from the surface of the resist pattern 3c to the inside of the resist pattern 3c. During the dispersion, as illustrated in FIG. 9, when the substrate, for example, the semiconductor wafer W, where the resist pattern 3c is formed, is baked using the baker 5 as in the first example. The baking of the substrate may increase the amount of dispersion of the reaction material, for example, the acid $H^+$, as in the first example. Also, the baking of the substrate may activate the acid $H^+$ dispersed in the resist pattern 3c, thus facilitating the change from the insoluble layer 3b to the new soluble layer 3e. An example of the change from the insoluble layer 3b to the new soluble layer 3e is, as in the second example, a change from an alkali insoluble protecting group to an alkali soluble group (a solubilization material) using the acid $H^+$ as a catalyst component.

The range of the baking temperature in the second example is substantially the same as that of the first example.

As described above, as the reaction material, for example, acid $H^+$, is dispersed from the surface of the resist pattern 3c to the inside of the resist pattern 3c in a liquid or gas state, the new soluble layer 3e may be formed in the surface of the resist pattern 3c from which the intermediate exposed area 3d is removed.

Next, referring to FIG. 1(F), the new soluble layer 3e is removed from the resist pattern 3c on which the new soluble layer 3e is formed. An example of the removal is development.

In the present embodiment, the new soluble layer 3e is removed by spraying an alkali solvent (a developer) on the resist pattern 3c on which the new soluble layer 3e is formed. Then, if necessary, post-baking is performed to harden the resist pattern 3c. Thus, a third development process is completed.

According to the present embodiment, since the intermediate exposed area 3d of FIG. 1(D) is removed (the second development process) and the new soluble layer 3e of FIG. 1(F) is removed (the third development process), after the first development process of FIG. 1(C), the resist pattern 3c has a line width CDfnl that is thinner than an line width CDint of the resist pattern 3c in the first development process.

In addition, the amount of slimming in the final line width CDfnl of the resist pattern 3c is a sum of the amount of slimming according to the removal of the intermediate exposed area 3d from the initial line width CDint of the resist pattern 3c and the amount of slimming according to the removal of the new soluble layer 3e. Thus, the amount of slimming of the resist pattern 3c may be increased, compared to a conventional slimming method having a single slimming process. In detail, when the line width (CD) of the resist pattern 3c after the first development process is 60 nm, a total thickness of about 25 nm of slimming including the removal of the intermediate exposed area 3d by about 10 nm and the removal of the new soluble layer 3e by about 15 nm is obtained. Thus, for example, when an exposure technique to obtain a resist pattern having a line width of 60 nm is used, the final line width of a resist pattern is about 35 nm, that is, almost half.

Also, according to the present embodiment, the intermediate exposed area 3d is removed from the resist pattern 3c after the first development process is completed. Accordingly, the new soluble layer 3e may be formed in the resist pattern 3c having a clean surface portion. In the present embodiment, the clean surface portion indicates a state in which the surface portion hardly has an extra solubilization material and/or reaction material. In the present embodiment, the new soluble layer 3e is formed in the resist pattern 3c that hardly has an extra alkali soluble base and/or acid. Thus, compared to a case in which the new soluble layer 3e is formed in the resist pattern 3c from which the intermediate exposed area 3d is not removed, the resist pattern 3c may be slimmed in a state in which it is difficult to generate the pattern collapse. As a reference example supporting the above description, a FIG. 10(A) is a scanning electron microscope (SEM) image of a case in which a new soluble layer is formed in a resist pattern where the intermediate exposed area is not removed and then the new soluble layer is removed.

Referring to FIG. 10(A), the resist pattern is collapsed using the slimming method in which the new soluble layer is formed in the resist pattern where the intermediate exposed area is not removed. One of the reasons may be that a solubilization material or a reaction material, that is, an alkali soluble group or acid in the present embodiment, remains at the side surface of the resist pattern 3c so that the remnant makes the new soluble layer 3e abnormally grow when the new soluble layer 3e is formed. As a result, as in the reference example of FIG. 10(A), pattern collapse may easily occur in case of using the slimming method in which the new soluble layer is formed in the resist pattern where the intermediate exposed area is not removed. Thus, there is a limit in the slimming of the resist pattern in the reference example.

FIG. 10(B) is a SEM image showing a resist pattern that is slimmed according to the present embodiment.

Referring to FIG. 10(B), in the present embodiment, the resist pattern may be slimmed without generating the pattern collapse. Thus, according to the present embodiment, compared to a case in which the new soluble layer 3e is formed in the resist pattern where the intermediate exposed area is not removed, the resist pattern 3c may be slimmed without generating the pattern collapse.

As described above, according to the present embodiment, a resist pattern may be slimmed without the collapse of a pattern.

Also, according to the present embodiment, a pattern roughness (LWR: line width roughness) may be improved.

Figure 11:
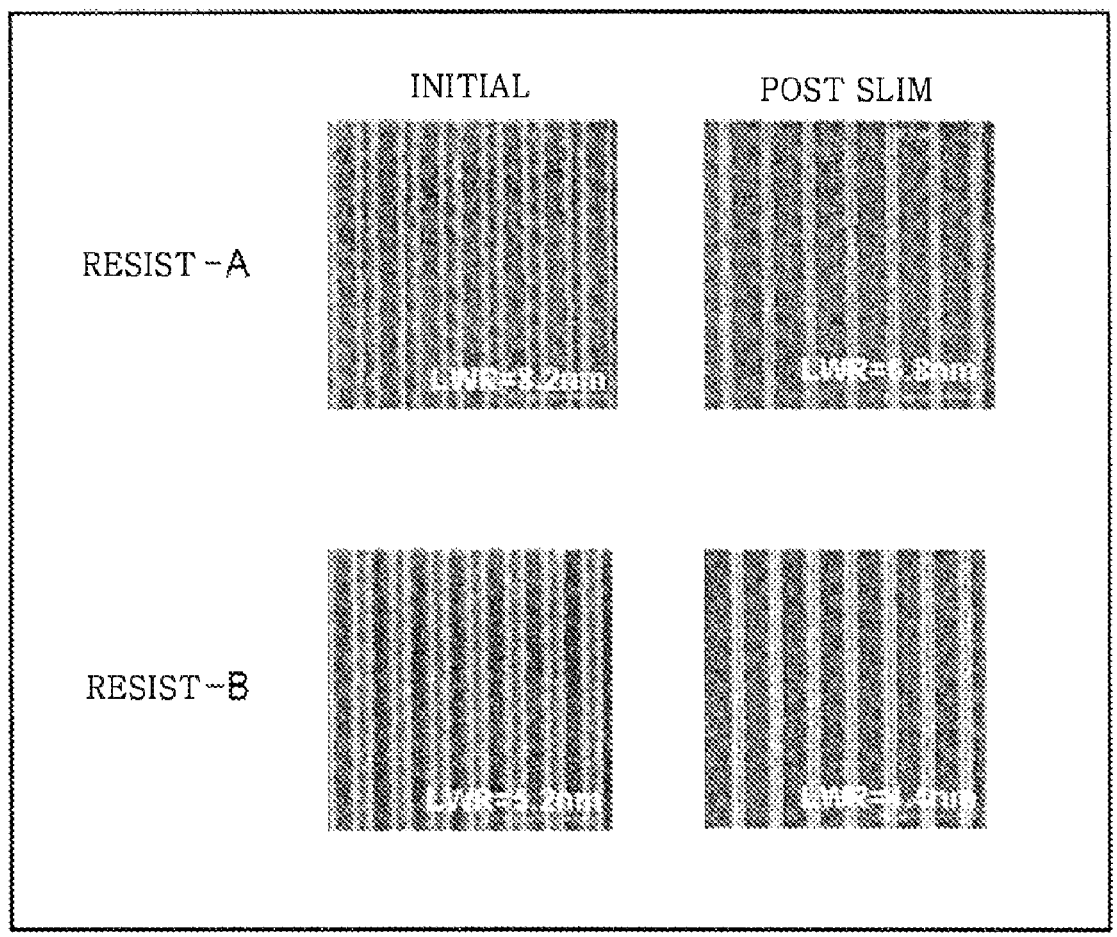
FIG. 11 is SEM images showing examples of resist patterns formed using the slimming method according to the first embodiment.

FIG. 11 are SEM images showing examples of resist patterns before and after slimming.

Referring to FIG. 11, a resist-A has an LWR of 8.2 nm before slimming. As a result of the slimming according to the present embodiment, the LWR may be reduced to 6.8 nm. Also, a resist-B has an LWR of 5.2 nm before slimming and the LWR may be reduced to 4.4 nm.

Thus, according to the present embodiment, since the LWR of the resist is improved, a resist pattern that has a slight unevenness difference and a superior shape may be formed.

When the line width (CD) of the resist pattern decreases, for example, to 40 nm, 30 nm, 20 nm, etc., a slight unevenness difference may have a great influence on the shape of the resist pattern.

In contrast, according to the present embodiment, a resist pattern having a slight unevenness difference and a superior shape may be formed. Thus, the slimming method of the present embodiment is advantageous in the miniaturization of a resist pattern in the future.

Also, in the present embodiment, during the third development process (the removal of the new soluble layer), the same development process as the first development process is performed.

However, in the third development process (the removal of the new soluble layer), it may be seen that, if the same development process (hereinafter, referred to as the pre-treatment development) as the second development process (the removal of the intermediate exposed area) is performed, the resist pattern may be further slimmed. A result thereof is shown in Table 1 below. In Table 1, the development conditions are typically a developer temperature of 23° C., a developer concentration of 2.38%, and a development time of 60 seconds. Also, the conditions for the pre-treatment development are a developer temperature of 45° C., a developer concentration of 2.38%, and a development time of 60 seconds.

TABLE 1

|  | Initial | Typical Development | Pre-treatment Development |
|---|---|---|---|
| CD [nm] | 45.0 | 32.8 | 28.4 |
| Slimming Amount [nm] | — | 12.2 | 16.6 |

As described above, in the third development process (the removal of the new soluble layer), the resist pattern may be further slimmed by performing the same high temperature or high concentration development process as the pre-treatment development, or a long-term development process, compared to the typical development.

Also, a preferable condition range for a case of performing the third development process in the same conditions as those of the pre-treatment development is the same as that of the second development process.

The performing of the third development process in the same conditions as those of the pre-treatment development may be applied to other embodiments described below.

Second Embodiment

In the first embodiment, the new soluble layer 3e is formed inside the resist pattern 3c from the surface of the resist pattern 3c from which the intermediate exposed area 3d is removed. The new soluble layer 3e formed using the above method covers the entire surface of the resist pattern 3c from the side surface to the upper surface of the resist pattern 3c. Thus, the resist pattern 3c is isotropically slimmed in directions along the width and height thereof. In the isotropical slimming, since the upper surface portion of the resist pattern is removed, the height of the resist pattern 3c is decreased. This is unnecessary because the height needs to be maintained in some cases. For example, the height needs to be maintained when the resist pattern 3c is used as a mask when the underlayer 1 is etch processed.

In the present second embodiment, a resist pattern may be slimmed without a pattern collapse while reducing the slimming of the height of the resist pattern.

FIGS. 12(A)-12(E) are cross-sectional views illustrating a method of slimming a resist pattern, according to the second embodiment of the present invention.

Referring to FIG. 12(A), the resist pattern 3c from which the intermediate exposed area 3d is removed using the slimming method of FIGS. 1(A)-1(D) is obtained.

Referring to FIG. 12(B), an application layer 7 applying a reaction material is formed in the resist pattern 3c from which the intermediate exposed area 3d is removed. The reaction material generates a solubilization material that solubilizes the resist pattern 3c. A method described with reference to FIG. 8 or 9, for example, may be used as the method of applying the reaction material. An example of the reaction material is acid as in the first embodiment.

Referring to FIG. 12(C), a filling material 8 is filled between patterns of the resist pattern 3c. The filling material may be a fluid material which may be coated on the resist pattern 3c. The fluid material may be, for example, an immersion protecting film, or a top coat, used for immersion exposure. Also, the filling material 8 is filled between patterns of the resist pattern 3c such that an upper surface 9 of the resist pattern 3c may be exposed. To expose the upper surface 9, the filling material 8 is coated such that the thickness of a coating layer of the filling material 8 may be, for example, almost the same as the height h of the resist pattern 3c.

Referring to FIG. 12(D), a material that removes the characteristic that the reaction material changes the insoluble layer to a soluble layer, for example, a neutralization material, is applied from the upper surface 9 of the exposed resist pattern 3c to the resist pattern 3c. As the neutralization material is applied from the upper surface 9 of the resist pattern 3c to the resist pattern 3c, a portion indicated by a dotted oval line 10 that is formed in the upper surface 9 of the resist pattern 3c of the application layer 7 formed in the overall surface of the resist pattern 3c may be neutralized. The application layer 7 remains only on the side surface of the resist pattern 3c due to the neutralization. An example of the neutralization material is an amine based material when the reaction material is acid. An example of a method of applying the neutralization material to the resist pattern 3c is to disperse the neutralization material in the resist pattern 3c. An example of the dispersion method is a gas dispersion method (please refer to FIG. 13) used to disperse the neutralization material from a neutralization gas including the neutralization material or a liquid dispersion method (please refer to FIG. 14) used to equally disperse the neutralization material from a neutralization liquid including the neutralization material.

Figure 13:
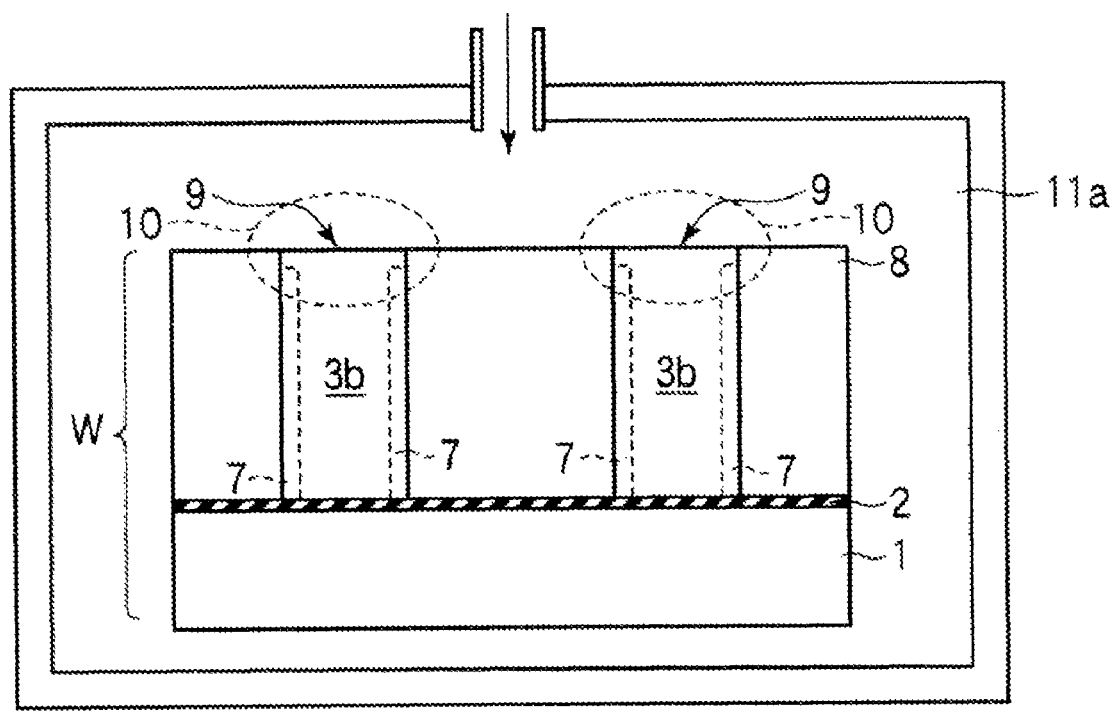
FIG. 13 is a cross-sectional view for explaining a first dispersion example in which neutralization material is dispersed in a resist pattern.

When the neutralization material is applied using the gas dispersion method, as illustrated in FIG. 13, a substrate where the resist pattern 3c is formed, for example, a semiconductor wafer W, is input to the process chamber 6 and the neutralization gas including the neutralization material is supplied to the process chamber 6 so that the upper surface 9 of the resist pattern 3c is exposed in an atmosphere 11a including the neutralization material. In the atmosphere 11a including the neutralization material, the neutralization material is dispersed in the resist pattern 3c from the upper surface 9 of the resist pattern 3c. An example of the neutralization gas may be an amine based gas when the reaction material is acid.

Figure 14:
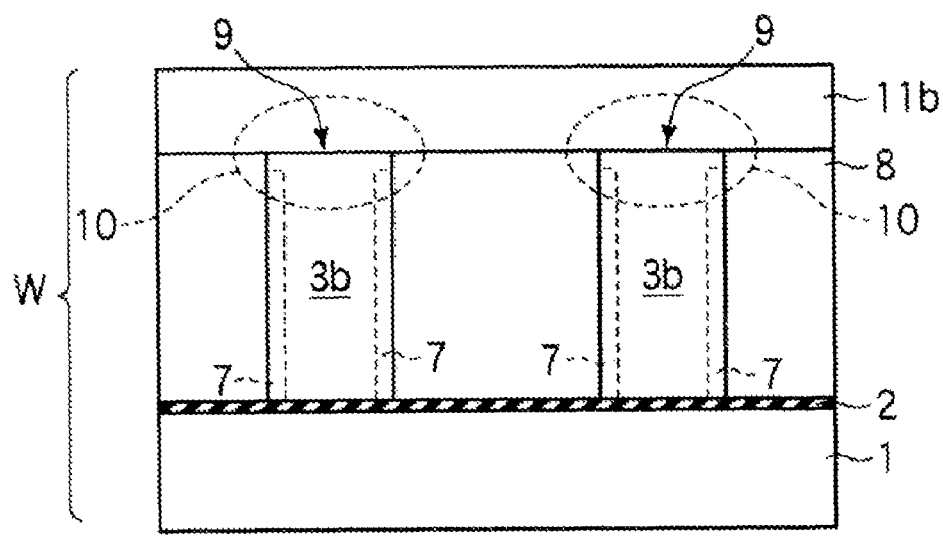
FIG. 14 is a cross-sectional view for explaining a second dispersion example in which neutralization material is dispersed in a resist pattern.

Also, when the neutralization material is applied using the liquid dispersion method, as illustrated in FIG. 14, a neutralization solution 11b including the neutralization material is coated on the resist pattern 3c. The neutralization material of the neutralization solution 11b is dispersed from the upper surface 9 of the resist pattern 3c into the resist pattern 3c. An example of the neutralization solution may be an amine based solution when the reaction material is acid.

When a material including the reaction material, for example, the reaction material is acid, the neutralization material of the amine based gas or amine based solution is dispersed from the upper surface 9 of the resist pattern 3c into the resist pattern 3c. Accordingly, the reaction material is neutralized from the upper surface portion of the resist pattern 3c so that the characteristic of the reaction material to change an insoluble layer to a soluble layer is removed. Thus, the application layer 7 may remain only at the side surface portion of the resist pattern 3c due to the neutralization.

Referring to FIG. 12(E), the substrate where the resist pattern 3c is formed, that is, the semiconductor wafer W, is baked using the baker 5. Accordingly, the reaction material applied to the application layer 7, for example, acid, is dispersed into the resist pattern 3c. Also, as the dispersed acid is activated, for example, a change from an alkali insoluble protecting group to an alkali soluble group (a solubilization material) using acid as a catalyst component is facilitated so that the new soluble layer 3e may be formed at the side surface of the resist pattern 3c.

Then, the new soluble layer 3e is removed using the method described with reference to FIG. 1(F).

As described above, according to the present embodiment, since the characteristic of the reaction material applied to the upper surface portion of the resist pattern 3c to change an insoluble layer to a soluble layer is removed, the new soluble layer 3e may be formed only in the side surface of the resist pattern 3c so that the lowering of the height h of the resist pattern 3c may be prevented.

The present embodiment may be effectively employed, for example, when the slim resist pattern 3c is used as a mask for etching the underlayer 1.

Next, a method of slimming a resist pattern according to a modified example of the present embodiment will be described.

The modified example is applicable in case of that, when the new soluble layer 3e is formed, the reaction material is dispersed in the resist pattern 3c in a liquid state.

FIGS. 15(A)-15(C) are cross-sectional views illustrating a method of slimming a resist pattern, according to the second embodiment of the present embodiment.

Referring to FIG. 15(A), a reaction material, that is, an acid solution 4a including acid $H^+$ in the present example, is coated to a height that is almost the same as the height h of the resist pattern 3c such that the upper surface 9 of the resist pattern 3c may be exposed. Although the acid solution 4a is coated such that the upper surface 9 of the resist pattern 3c may be exposed, since the acid solution 4a passes over the upper surface of the resist pattern 3c during the coating, the application layer 7 is formed also in the upper surface 9.

Referring to FIG. 15(B), in the same manner as the process described with reference to FIG. 12(D), a material, for example, a neutralization material, that removes the characteristic of the reaction material to change an insoluble layer to a soluble layer is applied from the upper surface 9 of the exposed resist pattern 3c to the resist pattern 3c. Accordingly, as indicated by the dotted oval line 10, a portion formed in the upper surface 9 of the resist pattern 3c among the application layer 7 formed in the surface of the resist pattern 3c may be neutralized. The neutralization method may be any of the methods described with reference to FIGS. 13 and 14.

Referring to FIG. 15(C), in the same manner as the process described with reference to FIG. 12(E), the substrate, for example the semiconductor wafer W, where the resist pattern 3c is formed is baked using the baker 5. Accordingly, the acid applied to the application layer 7 is dispersed in the resist pattern 3c, and the acid is activated so that the new soluble layer 3e is formed in the side surface of the resist pattern 3c.

Then, the new soluble layer 3e is removed using the method described with reference to FIG. 1(F).

As described above, according to the present embodiment, when the reaction material, for example, acid, is dispersed in the resist pattern 3c using the acid solution 4a, since the acid solution 4a is coated such that the upper surface 9 of the resist pattern 3c may be exposed. Thus, the formation of the application layer 7 of the reaction material and the filling between the patterns to apply the neutralization material from the upper surface 9 may be performed in a single process. As a result, since the number of processes is decreased, the manufacturing costs may be reduced and yield and throughput may be improved.

Third Embodiment

A third embodiment of the present invention is related to an example of a method of manufacturing a semiconductor device using the above-described slimming method.

FIGS. 16-24 are cross-sectional views illustrating a method of manufacturing a semiconductor device, according to another embodiment of the present invention.

Figure 16:
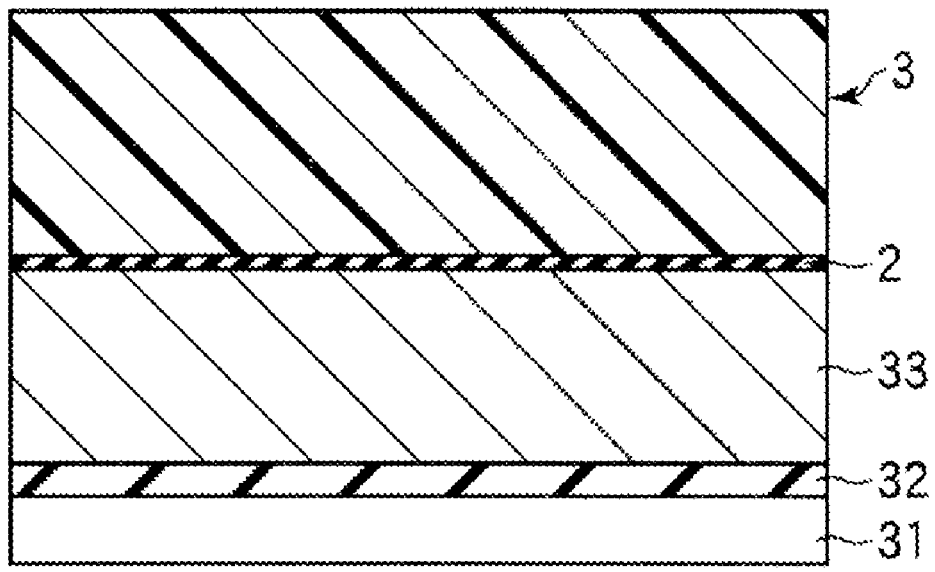
FIGS. 16-24 are cross-sectional views illustrating an example of a method of manufacturing a semiconductor device, according to a third embodiment of the present invention.

Referring to FIG. 16, an etching stopper 32 is formed on an underlayer 31 that is, for example, a semiconductor wafer or an interlayer insulation film formed on a wafer. A conductive polysilicon layer 33, for example, is formed on the etching stopper 32. A BARC 2 is formed on the polysilicon layer 33. Then, resist is coated on the BARC 2 and the coated resist is pre-baked to be solidified, thereby forming a resist layer 3. An example of the resist may be a chemically amplified resist, as in the first embodiment, which includes PAG and changes an alkali insoluble protecting group to an alkali soluble group (a solubilization material) using the generated acid as a catalyst component.

Figure 17:
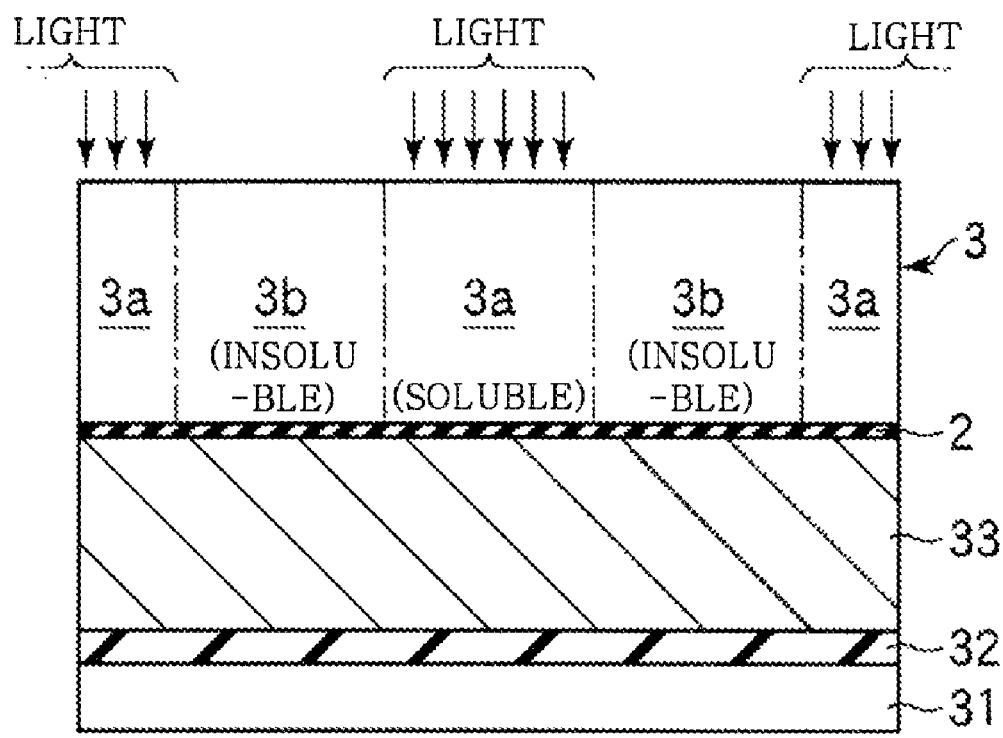

Referring to FIG. 17, a selected portion of the resist layer 3 is exposed so that an exposed pattern formed of, for example, a soluble layer 3a that is soluble to an alkali solvent and an insoluble layer 3b that is insoluble to the alkali solvent may be formed in the resist layer 3. The exposed pattern may be formed, for example, using the same method as that described with reference to FIG. 1(B).

Figure 18:
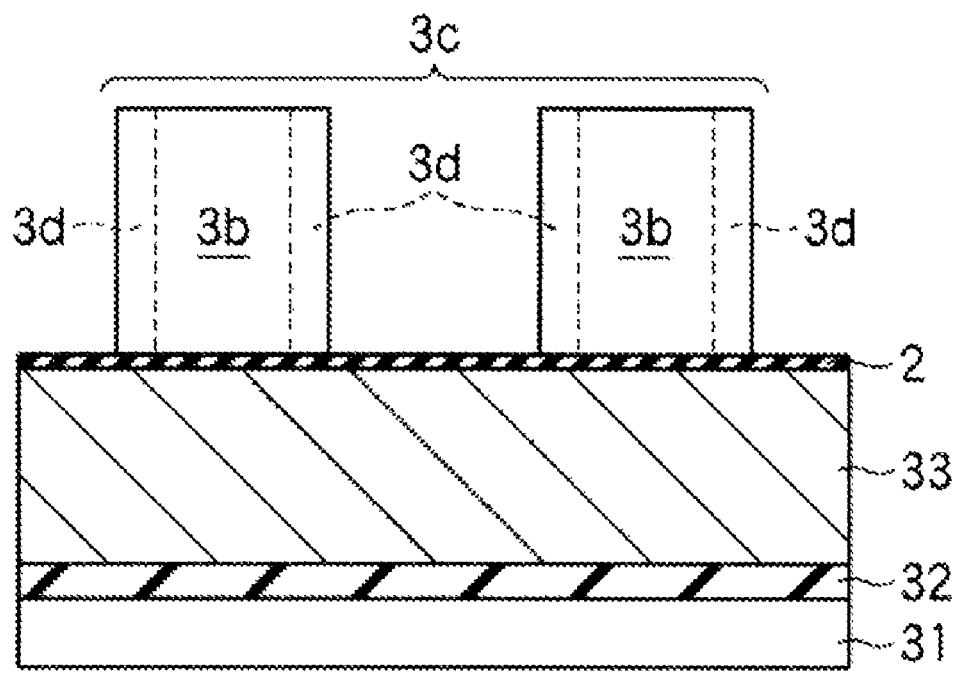

Referring to FIG. 18, the soluble layer 3a is removed from the resist layer 3 and a resist pattern 3c having the pattern of the insoluble layer 3b is formed. In this regard, the resist pattern 3c may be formed using the same method as that described with reference to FIG. 1(C).

Figure 19:
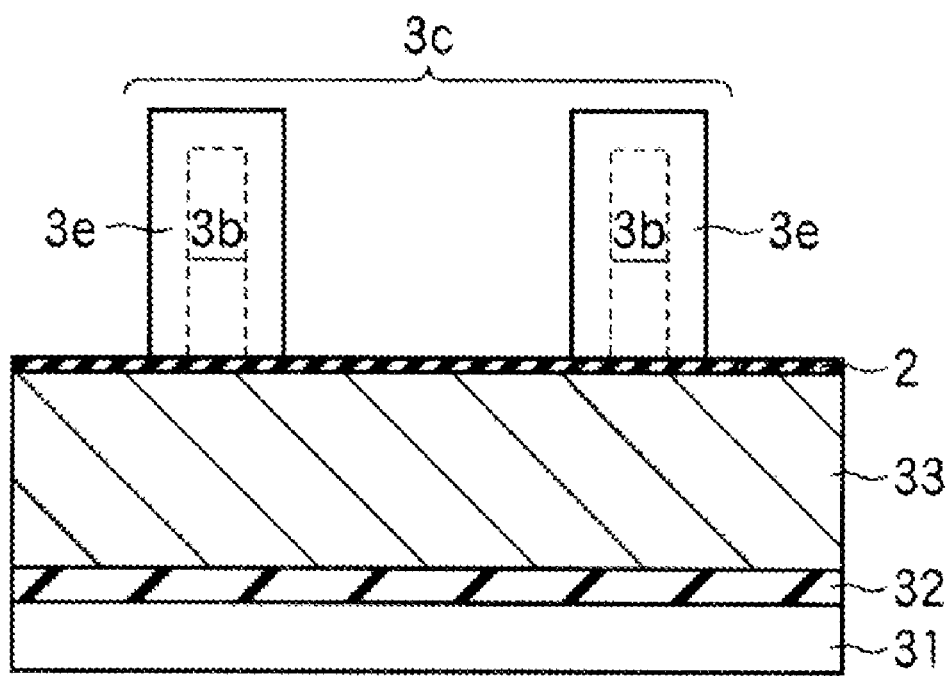

Referring to FIG. 19, an intermediate exposed area 3d is removed from the resist pattern 3c. In this regard, the intermediate exposed area 3d may be removed using the same method as that described with reference to FIG. 1(D). Next, a new soluble layer 3e is formed in the resist pattern 3c from which the intermediate exposed area 3d is removed. The new soluble layer 3e may be formed using the same method as that described with reference to FIG. 1(E).

Figure 20:
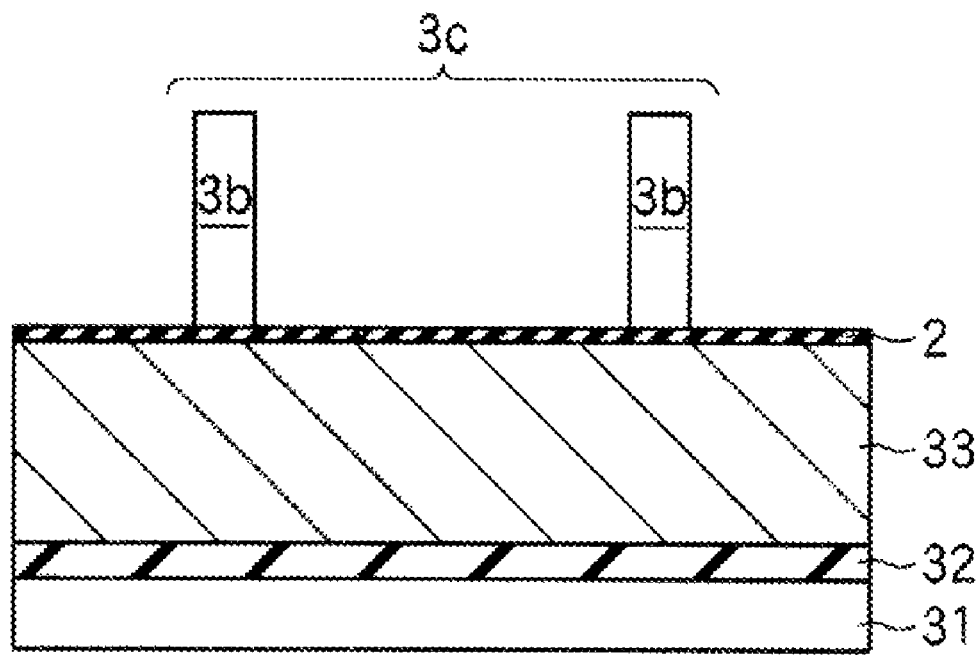

Referring to FIG. 20, the new soluble layer 3e is removed from the resist pattern 3c. In this regard, the new soluble layer 3e may be removed using the same method as that described with reference to FIG. 1(F).

Figure 21:
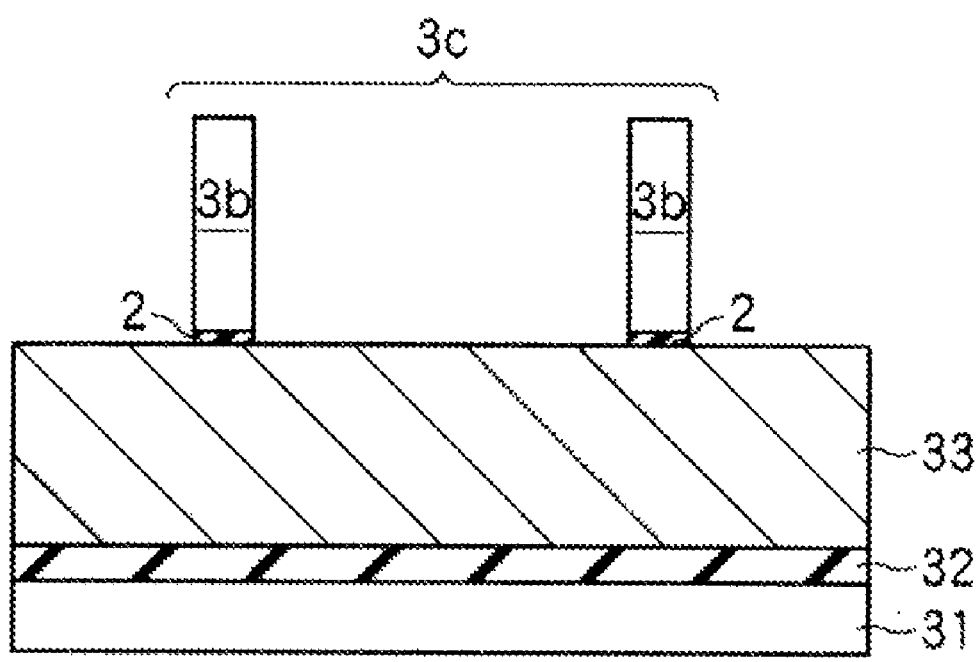

Referring to FIG. 21, the BARC 2 is removed using the resist pattern 3c from which the new soluble layer 3e is removed, as a mask.

Figure 22:
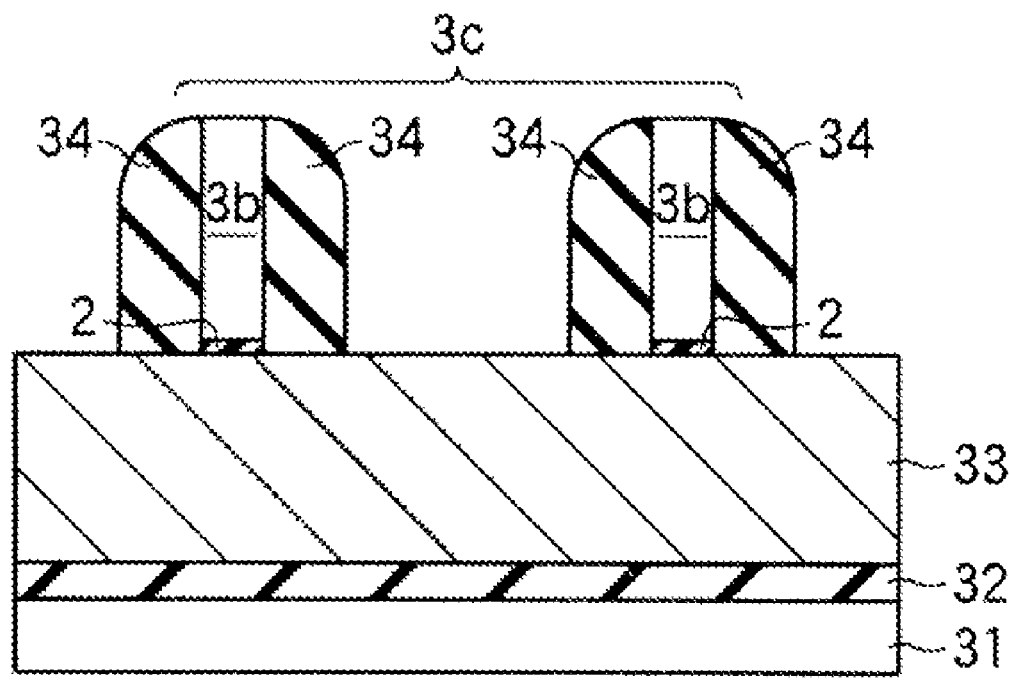

Referring to FIG. 22, a sidewall layer 34 is formed on the sidewall of the resist pattern 3c. The sidewall layer 34 may be formed using a well-known formation method. The sidewall layer 34 of the present embodiment may be used as an etching mask (a hard mask) later. Thus, in the present embodiment, the material of the sidewall layer 34 is selected from a material taking an etching selectivity with regard to the conductive polysilicon layer 33. In the present embodiment, the material of the sidewall layer 34 may be silicon dioxide.

Figure 23:
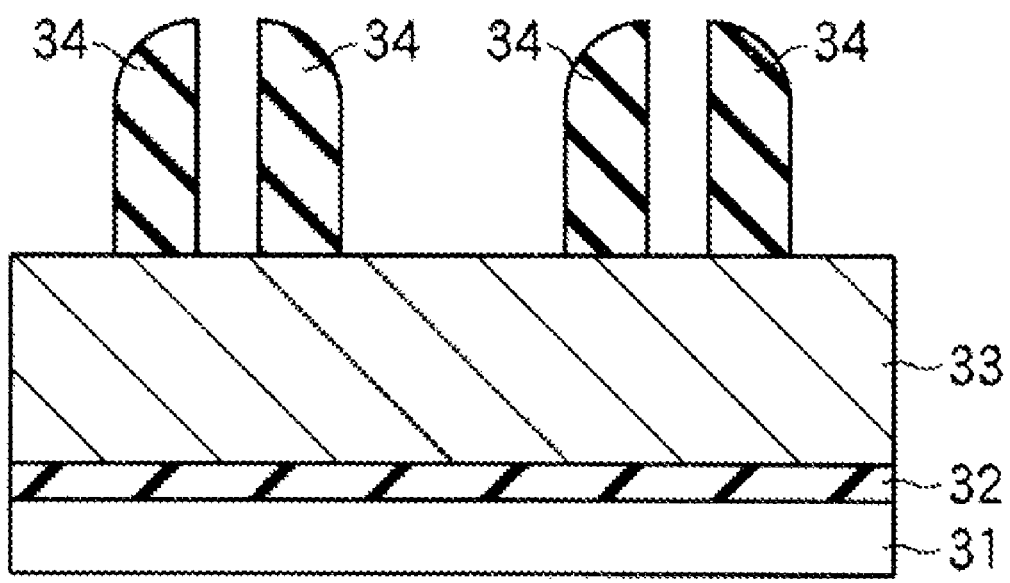

Referring to FIG. 23, the resist pattern 3c and the BARC 2 are removed using the sidewall layer 34, which is formed of silicon dioxide, as a mask.

Figure 24:
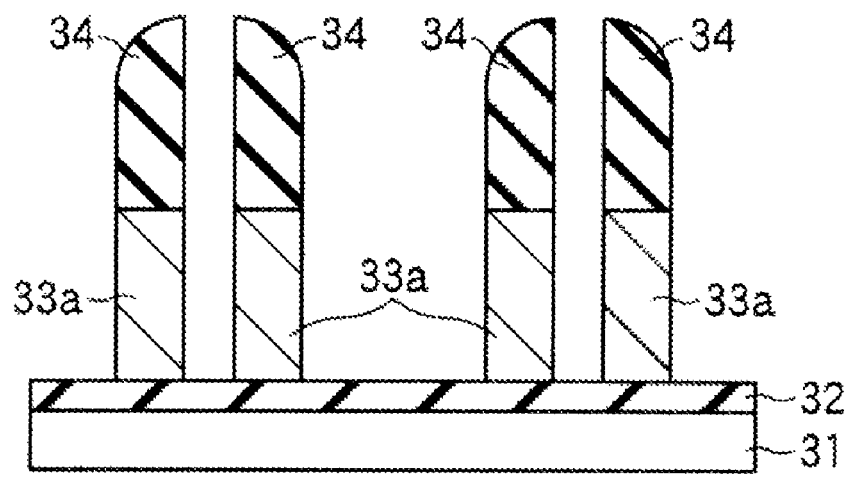

Referring to FIG. 24, the conductive polysilicon layer 33 is etched using the sidewall layer 34 as a mask. As a result, a conductive polysilicon pattern 33a having a width thinner than the initially formed width of the resist pattern 3c and arranged at intervals narrower than the initially formed intervals of the resist pattern 3c, is formed. The conductive polysilicon pattern 33a may be used as a gate electrode pattern of a semiconductor device, or a wiring pattern.

The above-described method of slimming a resist pattern according to the present embodiment may be applied to a method of manufacturing of a semiconductor device.

Also, in the present embodiment, when a degree of the height of the resist pattern 3c needs to be maintained, the method of neutralizing the upper portion of the resist pattern 3c according to the second embodiment may be employed.

Fourth Embodiment

A fourth embodiment of the present invention is related to another example of a method of manufacturing a semiconductor device using the above-described slimming method.

FIGS. 25-37 are cross-sectional views illustrating a method of manufacturing a semiconductor device, according to the fourth embodiment of the present invention.

Figure 25:
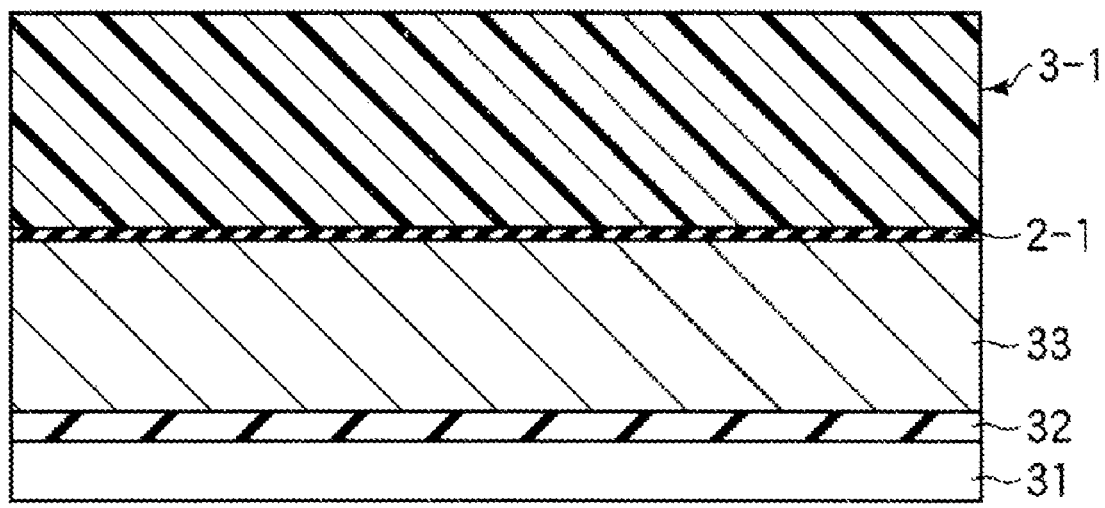
FIGS. 25-37 are cross-sectional views illustrating an example of a method of manufacturing a semiconductor device, according to a fourth embodiment of the present invention.

Referring to FIG. 25, an etching stopper 32, a conductive polysilicon layer 33, a first BARC 2-1, and a first resist layer 3-1 are formed, for example, on a semiconductor wafer or an underlayer 31 that is an interlayer insulation layer formed on a wafer, using the same method as that described with reference to FIG. 16. The first resist layer 3-1 may be formed of a chemically amplified resist, as in the first embodiment, which includes PAG and changes an alkali insoluble protecting group to an alkali soluble group (a solubilization material) using the generated acid as a catalyst component.

Figure 26:
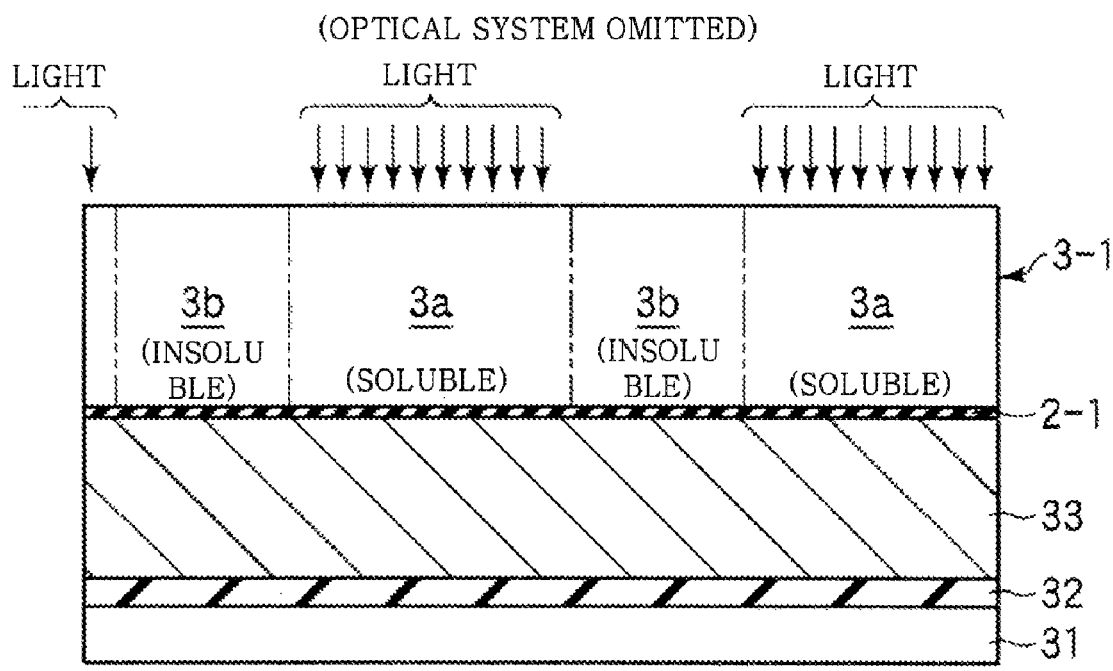

Referring to FIG. 26, a selected portion of the resist layer 3-1 is exposed to light using the same method as that described with reference to FIG. 1(B). Accordingly, an exposed pattern formed of, for example, a soluble layer 3a that is soluble to an alkali solvent and an insoluble layer 3b that is insoluble to the alkali solvent may be formed in the resist layer 3-1.

Figure 27:
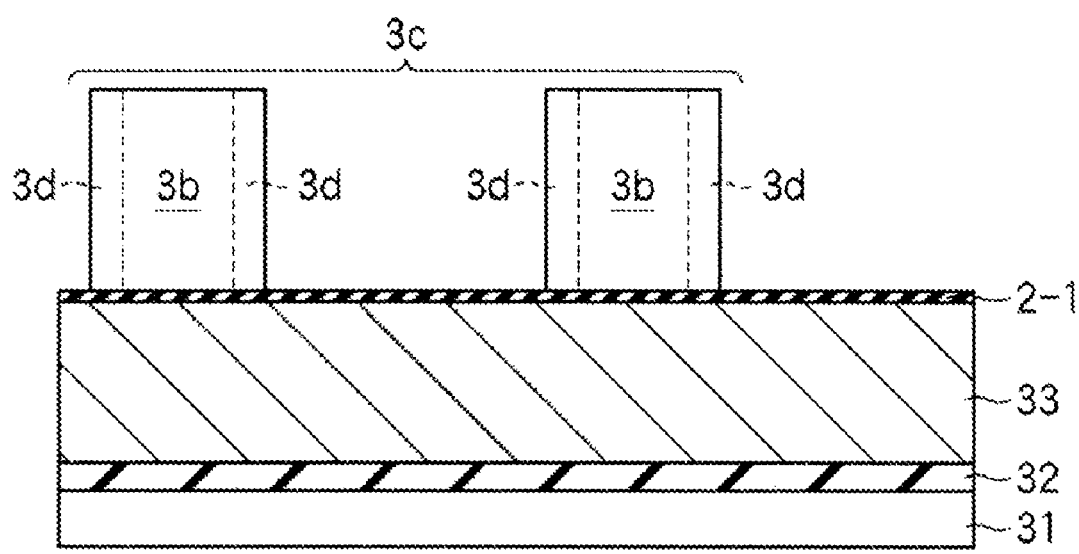

Referring to FIG. 27, the soluble layer 3a is removed from the resist layer 3-1 using the same method as that described with reference to FIG. 1(C) so that the resist pattern 3c having the pattern of the insoluble layer 3b is formed.

Figure 28:
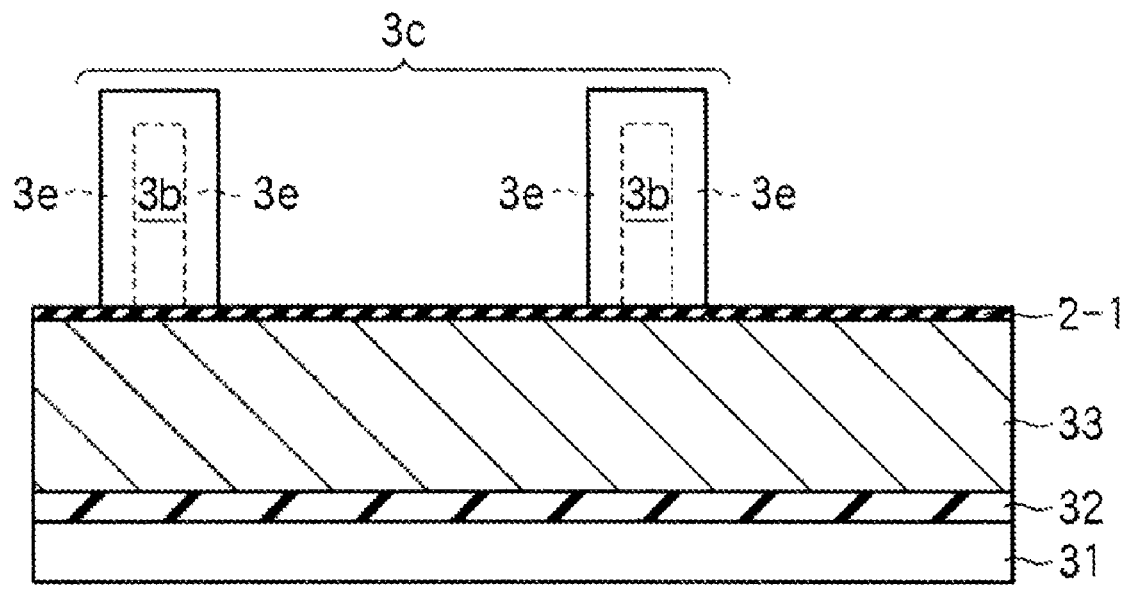

Referring to FIG. 28, the intermediate exposed area 3d is removed from the resist pattern 3c using the same method as that described with reference to FIG. 1(D). Next, the new soluble layer 3e is formed in the resist pattern 3c from which the intermediate exposed area 3d is removed, using the same method as that described with reference to FIG. 1(E).

Figure 29:
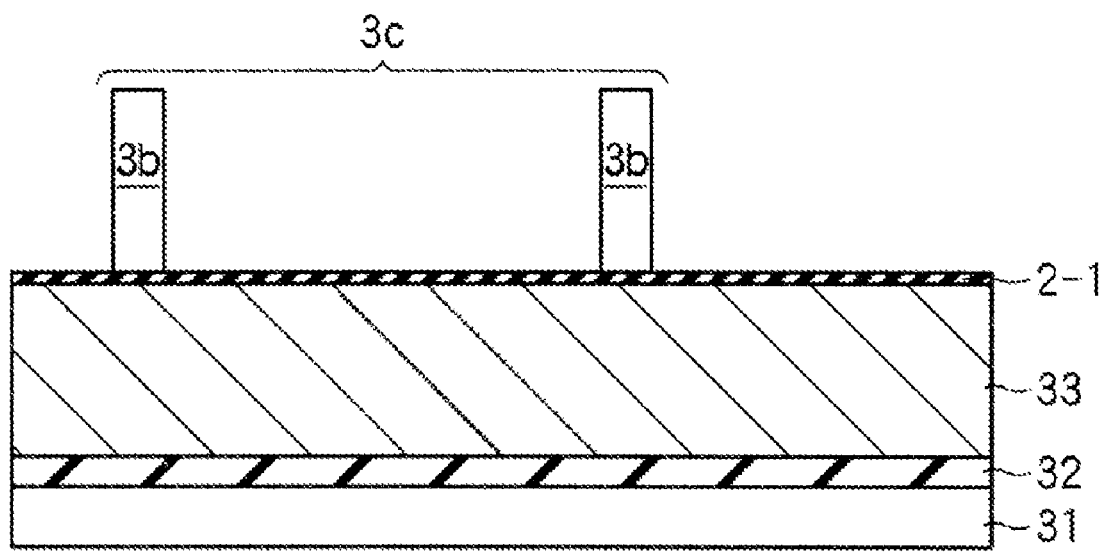

Referring to FIG. 29, the new soluble layer 3e is removed from the resist pattern 3c using the same method as that described with reference to FIG. 1(F).

Figure 30:
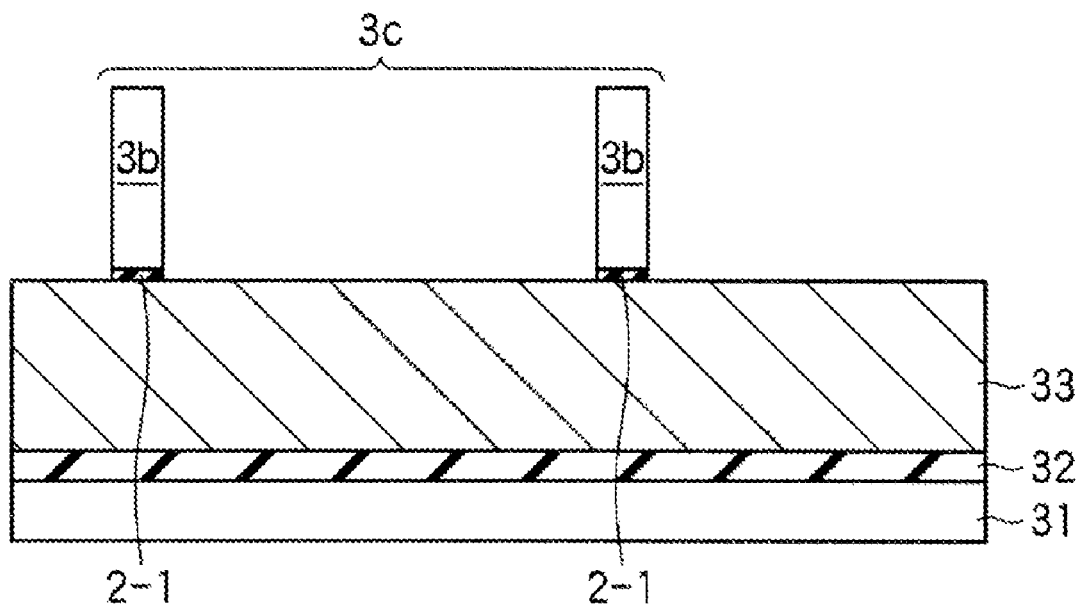

Referring to FIG. 30, the exposed portion of the BARC 2-1 is removed using the resist pattern 3c from which the new soluble layer 3e is removed, as a mask.

Figure 31:
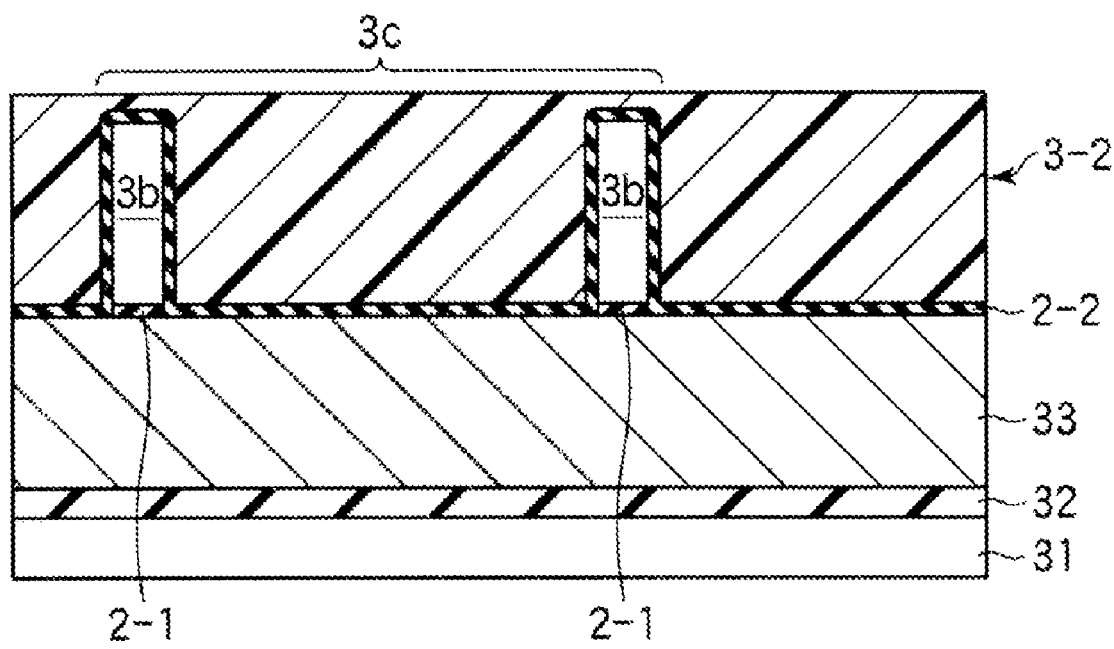

Referring to FIG. 31, a second BARC 2-2 is formed on the conductive polysilicon layer 33 and the resist pattern 3c. Next, a second resist layer 3-2 is formed on the second BARC 2-2. The material of the second BARC 2-2 may be the same as that of the first BARC 2-1 and the material of the second resist layer 3-2 may be the same as that of the first resist layer 3-1.

Also, there might be a worry that the resist pattern 3c may collapse when the second BARC 2-2 and the second resist layer 3-2 is formed. In that case, for example, so-called hardening process may be performed. The hardening process is a process which a silicon dioxide is thinly deposited, before the second BARC 2-2 is formed, so that the resist pattern 3c is hardened with a covering film.

Figure 32:
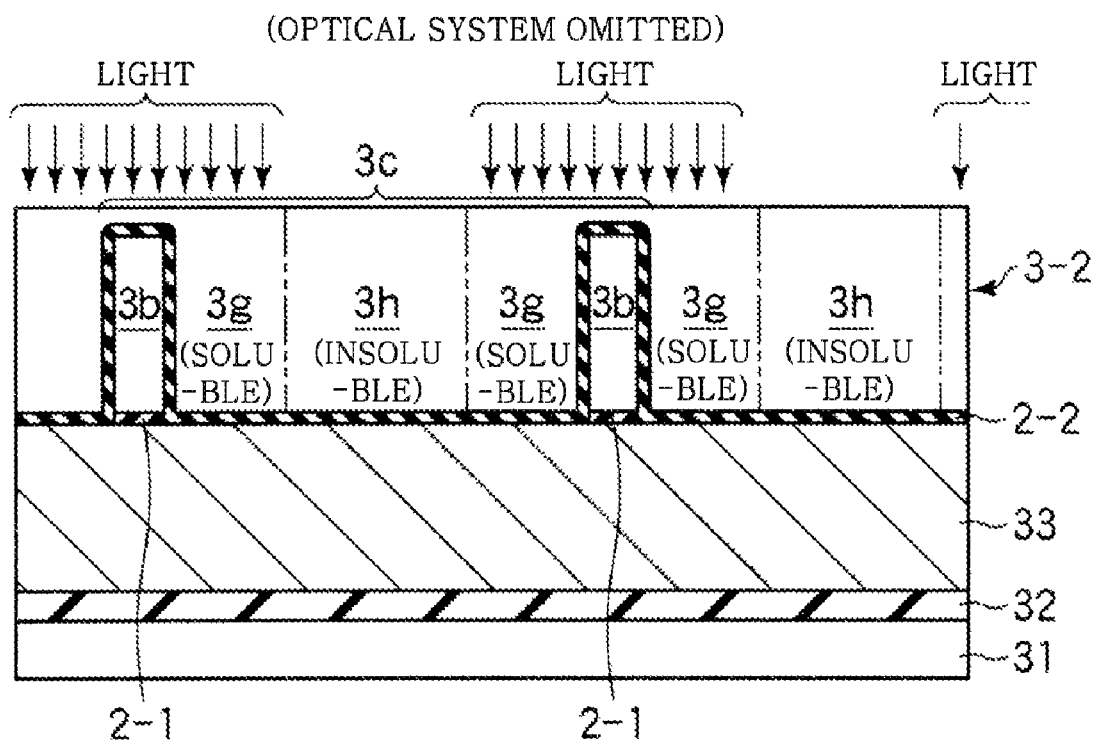

Referring to FIG. 32, a selected portion of the resist pattern 3-2 is exposed to light, for example, using the same method as that described with reference to FIG. 1(B). An exposed pattern formed of, for example, a soluble layer 3g that is soluble to an alkali solvent and an insoluble layer 3h that is insoluble to the alkali solvent may be formed in the resist layer 3-2. In the present embodiment, the exposed pattern is formed such that the insoluble layer 3h may be located in an area between the resist patterns 3c.

Figure 33:
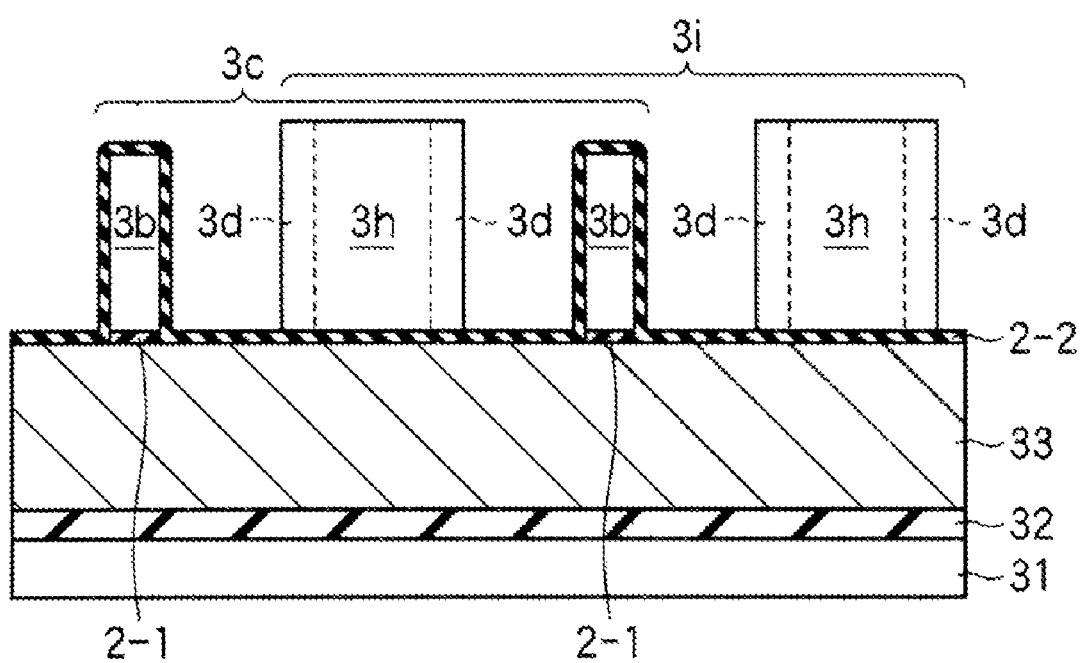

Referring to FIG. 33, the soluble layer 3g is removed from the resist layer 3-2 using the same method as that described with reference to FIG. 1(C). Thus, a resist pattern 3i having the pattern of the insoluble layer 3h is formed.

Figure 34:
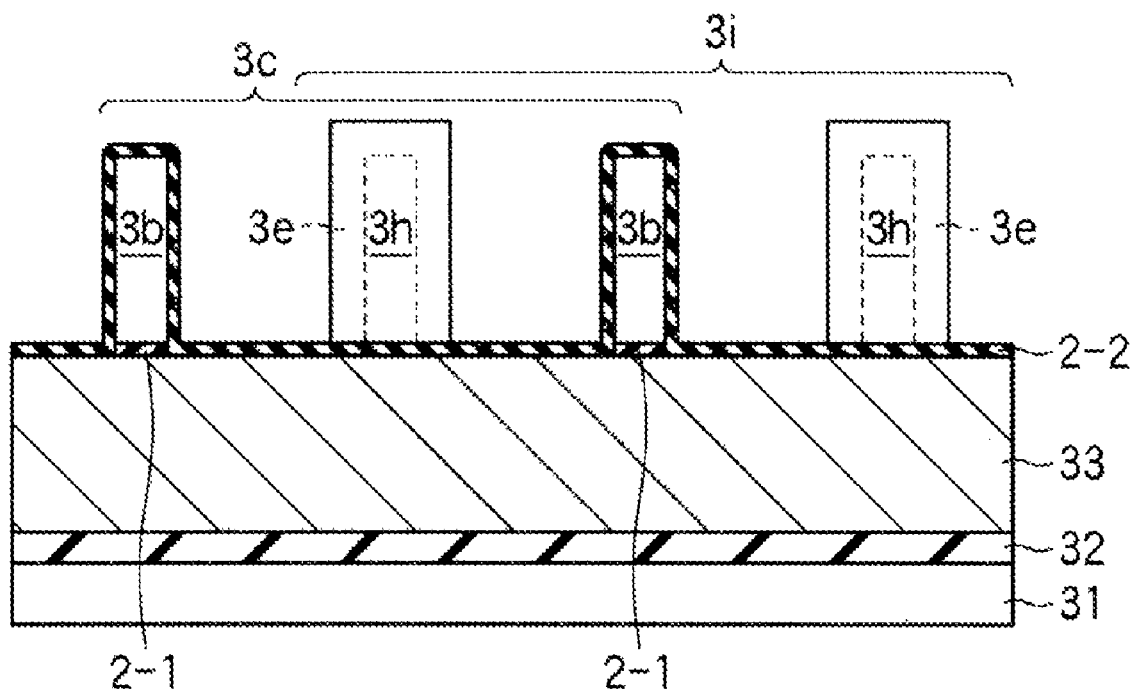

Referring to FIG. 34, the intermediate exposed area 3d is removed from the resist pattern 3i using the same method as that described with reference to FIG. 1(D). Next, the new soluble layer 3e is formed in the resist pattern 3i from which the intermediate exposed area 3d is removed, using the same method as that described with reference to FIG. 1(E).

Figure 35:
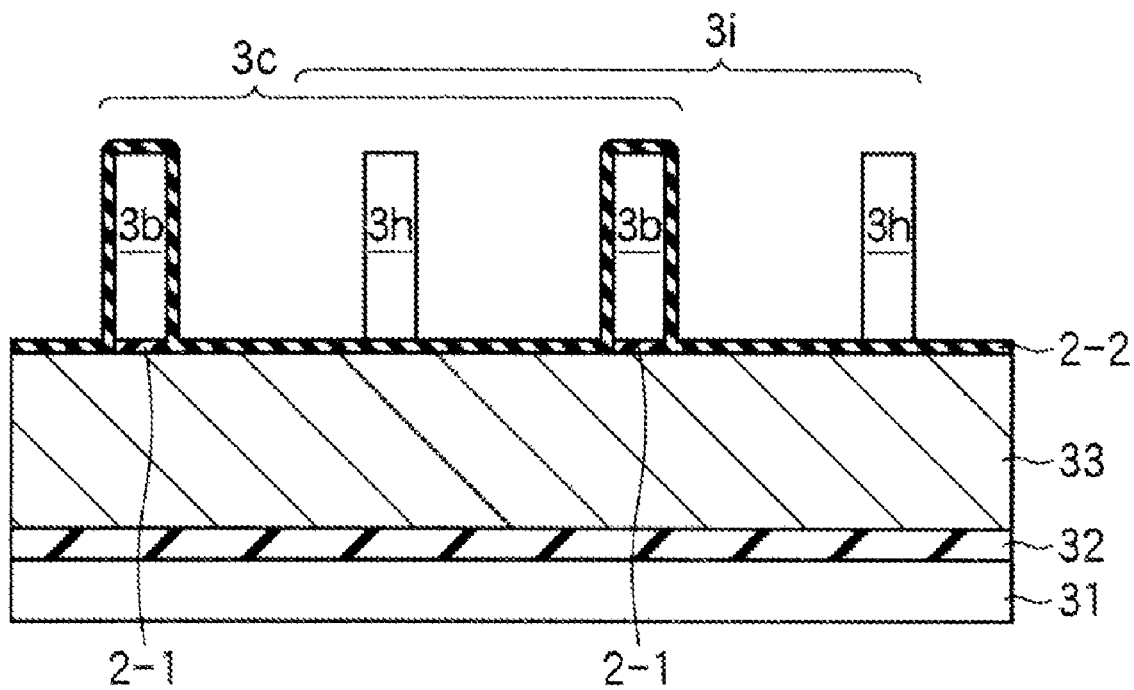

Referring to FIG. 35, the new soluble layer 3e is removed from the resist pattern 3i using the same method as that described with reference to FIG. 1(F).

Figure 36:
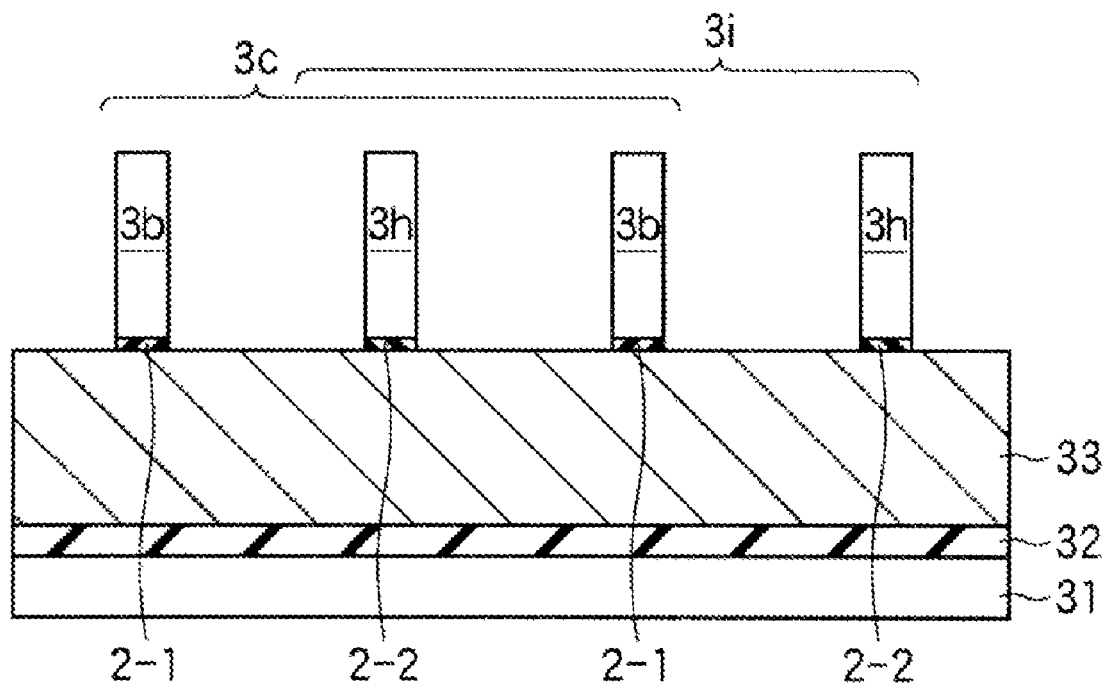

Referring to FIG. 36, the BARC 2-2 is removed using the resist pattern 3c that is already formed and the resist pattern 3i from which the new soluble layer 3e is removed, as a mask.

Figure 37:
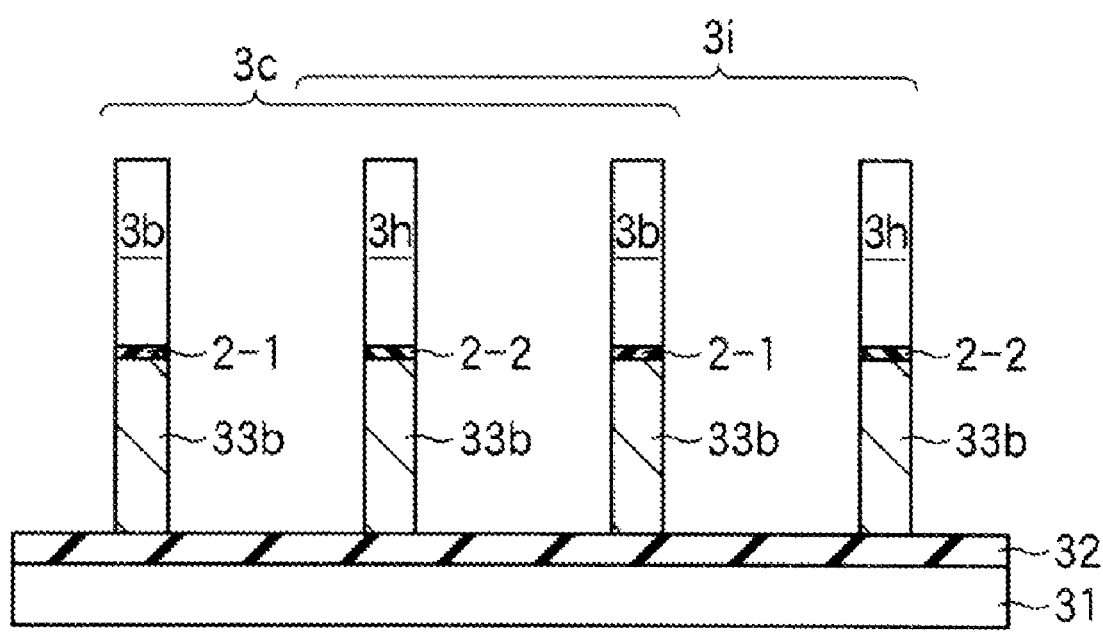

Referring to FIG. 37, the conductive polysilicon layer 33 is etched using the resist patterns 3c and 3i as a mask. As a result, a conductive polysilicon pattern 33 having a width thinner than the initially formed width of the resist pattern 3c and arranged at intervals narrower than the initially formed intervals of the resist pattern 3c, is formed.

The conductive polysilicon pattern 33b may be used as a gate electrode pattern of a semiconductor device, or a wiring pattern, as in the third embodiment.

Next, a method of manufacturing a semiconductor device according to another example of the fourth embodiment of the present invention will be described.

In the above-described example of the first embodiment of the present invention, a film in a layer which is below, that is, the conductive polysilicon layer 33 in the present embodiment, is etched using the resist pattern 3c that is initially formed and the resist pattern 3i that is formed next, as a mask, thereby forming the conductive polysilicon pattern 33b.

In this another example of manufacturing a semiconductor device according to the present embodiment, a sidewall layer is formed on the sidewall of the resist patterns 3c and 3i by combining the third embodiment and the fourth embodiment.

FIGS. 38(A)-38(C) are cross-sectionals view illustrating an another example of a method of manufacturing a semiconductor device, according to the fourth embodiment of the present invention.

According to the method described with reference to FIGS. 25-36, as illustrated in FIG. 36, the resist patterns 3c and 3i are formed on the BARC 2-1 and 2-2, respectively. The BARC 2-1 and 2-2 are removed using the resist patterns 3c and 3i as a mask.

Referring to FIG. 38(A), the sidewall layer 34 is formed on the sidewalls of the resist patterns 3c and 3i using a well-known method. The sidewall layer 34 of the present embodiment is used as an etching mask (a hard mask) layer as in the third embodiment. Thus, in the present embodiment, the material of the sidewall layer 34 is selected from a material taking an etching selectivity with regard to the conductive polysilicon layer 33. In the present embodiment, the sidewall layer 34 may be formed of silicon dioxide.

Referring to FIG. 38(B), the resist pattern 3c, the BARC 2-1, the resist pattern 3i, and the BARC 2-2 are removed using the sidewall layer 34 as a mask.

Referring to FIG. 38(C), the conductive polysilicon layer 33 is etched using the sidewall layer 34 as a mask. As a result, a conductive polysilicon pattern 33c is formed.

As a result, according to the another example of the fourth embodiment, the conductive polysilicon pattern 33c having a width thinner than the initially formed width of the resist pattern 3c and arranged at intervals narrower than the initially formed interval of the resist pattern 3c, may be formed. In addition, in the present embodiment, since the sidewall layer 34 is formed on the sidewall of the resist patterns 3c and 3i and used as an etching mask, a pattern in which patterns are repeated at a high density, that is, a dense pattern, compared to the example of the present embodiment using the resist patterns 3c and 3i as an etching mask, may be obtained.

The conductive polysilicon pattern 33c may be used as a gate electrode pattern of a semiconductor device, or a wiring pattern, as in the third embodiment and the one example of the fourth embodiment. Also, in the present embodiment, when a degree of the height of the resist patterns 3c and 3i needs to be maintained, the method of neutralizing the upper portions of the resist patterns 3c according to the second embodiment may be employed.

Fifth Embodiment

The present embodiment is related to an example of an apparatus for manufacturing a semiconductor device using the above-described slimming method.

One of the advantages of the slimming method according to the present invention is that a resist pattern may be slimmed in a single resist coating and developing system.

Figure 39:
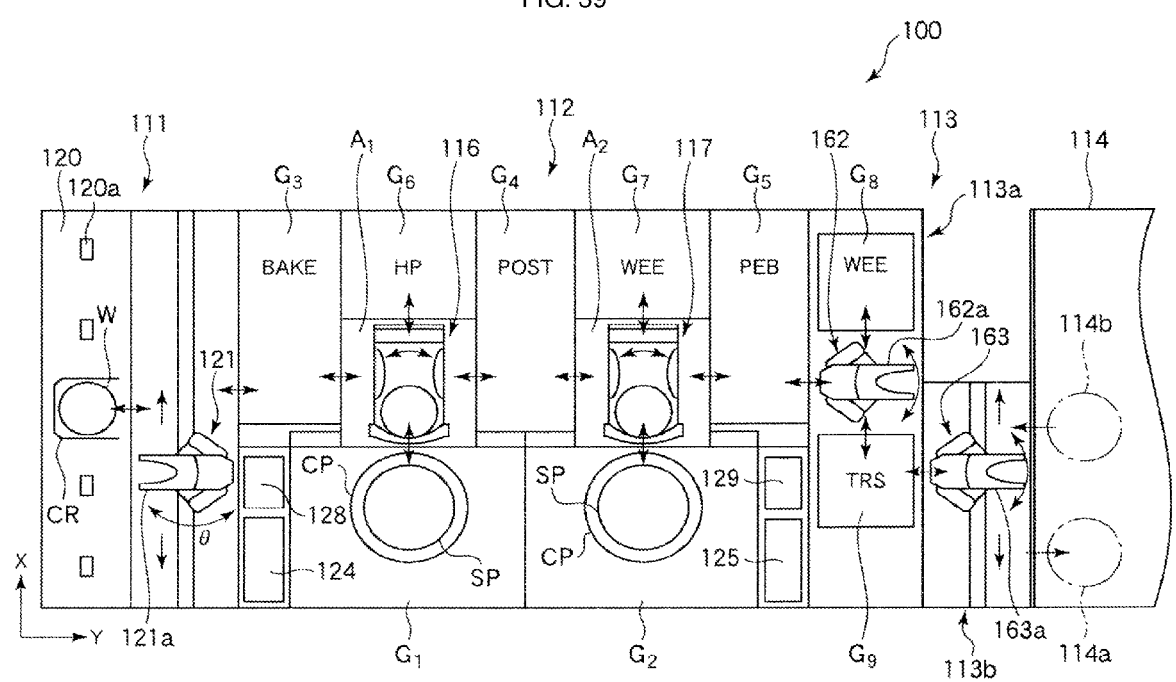
FIG. 39 is a plan view schematically illustrating a system for coating and developing resist, according to a fifth embodiment of the present invention.
Figure 40:
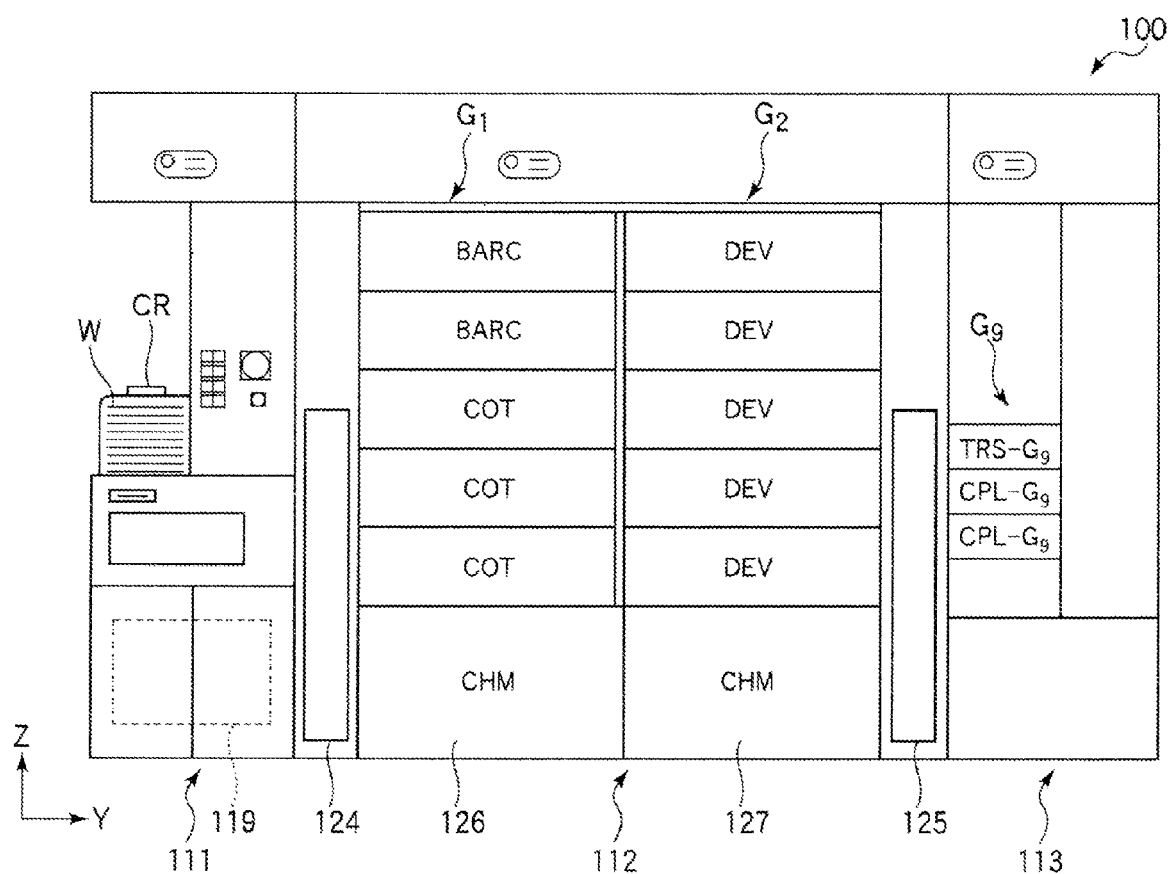
FIG. 40 is a front view of the system for coating and developing resist of FIG. 39.
Figure 41:
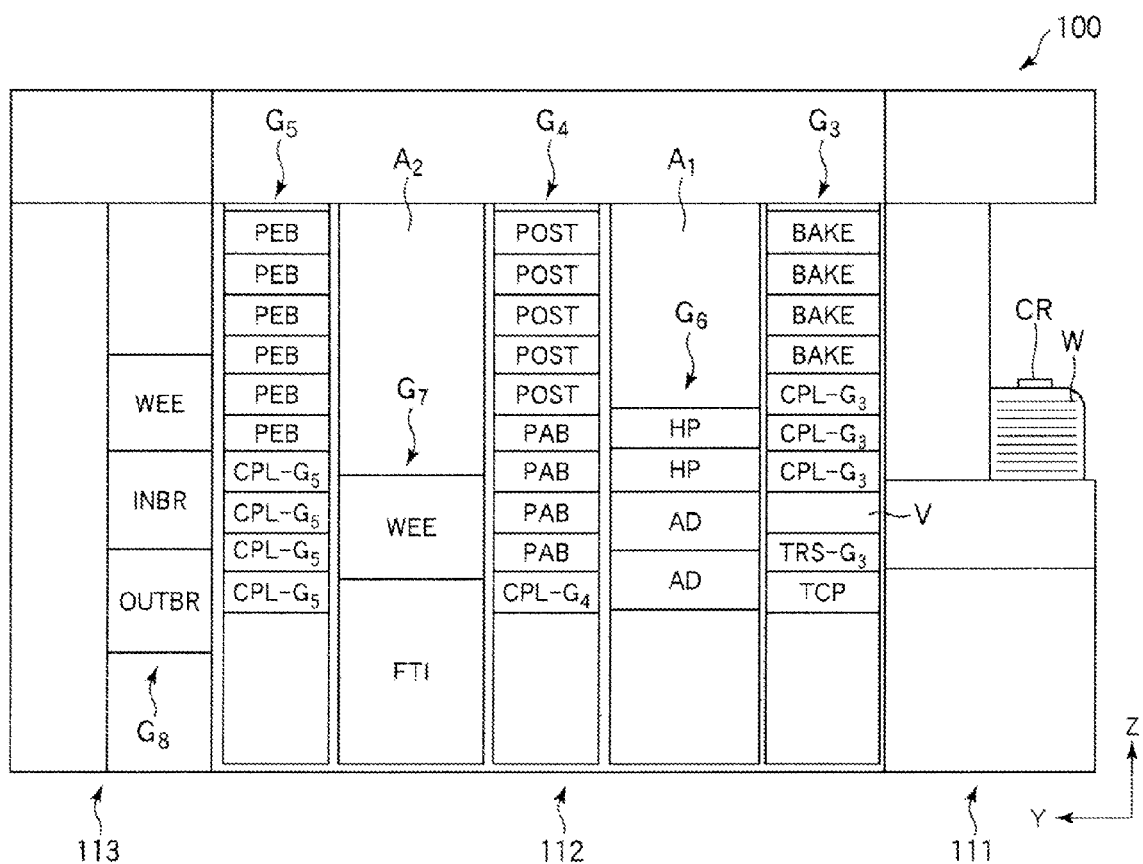
FIG. 41 is a rear view of the system for coating and developing resist of FIG. 39.

FIG. 39 is a plan view schematically illustrating a resist coating and developing system 100, according to an embodiment of the present invention. FIGS. 40 and 41 are, respectively, a front view and a rear view of the resist coating and developing system 100.

The resist coating and developing system 100 according to the present embodiment includes a cassette station 111 that is a transfer station, a process station 112 having a plurality of processing units, and an interface station 113 transferring wafers W between the process station 112 and an exposure unit 114 formed close to the process station 112.

In the resist coating and developing system 100, a wafer cassette CR in which a plurality of wafers W to be processed are horizontally accommodated is transferred to the cassette station 111 from another system. A wafer W that is completely processed in the resist coating and developing system 100 is transferred out from the cassette station 111 to another system. The cassette station 111 performs transfer of the wafer W between the wafer cassette CR and the process station 112.

Referring to FIG. 39, in the cassette station 111, a plurality of position determination protrusions 120a (five position determination protrusions 120a in FIG. 39) are formed in a row in a direction X on a cassette support plate 120. The wafer cassette CR is placed at the position determination protrusion 120a such that a wafer transfer entrance of the wafer cassette CR may face toward the process station 112.

In the cassette station 111, a wafer transfer mechanism 121 is located between the cassette support plate 120 and the process station 112. The wafer transfer mechanism 121 has a wafer transfer pick 121a capable of moving in the direction X in which wafer cassettes CR are arranged and a direction Z in which the wafers W in the wafer cassette CR are arranged. The wafer transfer pick 121a is rotatable in a direction θ illustrated in FIG. 39. Accordingly, the wafer transfer pick 121a may access any one of the wafer cassettes CR, and also may access a transition unit TRS-$G_3$ formed in a third process unit group $G_3$ of the process station 112 that will be described later.

In the process station 112, at the front side of the system, a first process unit group $G_1$ and a second process unit group $G_2$ are sequentially disposed at the side of the cassette station 111. At the rear side of the system, the third process unit group $G_3$, a fourth process unit group $G_4$, and a fifth process unit group $G_5$ are disposed sequentially from the side of the cassette station 111. A first major transfer unit $A_1$ is formed between the third process unit group $G_3$ and the fourth process unit group $G_4$. A second major transfer unit $A_2$ is formed between the fourth process unit group $G_4$ and the fifth process unit group $G_5$. Also, a sixth process unit group $G_6$ is formed at the rear side of the first main transfer unit $A_1$ while a seventh process unit group $G_7$ is formed at the rear side of the second main transfer unit $A_2$.

Referring to FIGS. 39 and 40, as a liquid supply unit performing a predetermined process by placing the wafer W on a spin chuck SP in a cup CP, five spinner type process units, for example, three resist coating units COT and two bottom coating units BARC which form an anti-reflection film which prevents reflection of light during exposure, are stacked in a five-layer structure in the first process unit group $G_1$. Also, in the second process unit group $G_2$, five spinner type units, for example, development units DEV, are stacked in a five-layer structure.

In the third process unit groups $G_3$, as illustrated in FIG. 41, from the bottom, a temperature control unit TCP, a transition unit TRS-$G_3$ that is a transfer unit of the wafer W between the cassette station 111 and the first main transfer unit $A_1$, an oven type process unit performing a predetermined process by placing the wafer W on a support plate, a spare space V that may form a desired oven type process unit, three high precision temperature control units CPL-$G_3$ performing a heat treatment process with respect to the wafer W under a precision temperature control, and four high temperature heat treatment units BAKE performing a predetermined heat treatment process with respect to the wafer W are stacked in a ten-layer structure.

In the fourth process unit group $G_4$, as illustrated in FIG. 41, from the bottom, a high precision temperature control unit CPL-$G_4$, four pre-bake units PAB performing a heat treatment process with respect to the wafer W after coating resist, and five post-bake units POST performing a heat treatment process with respect to the wafer W after development are stacked in a ten-layer structure.

In the fifth process unit group $G_5$, as illustrated in FIG. 41, from the bottom, four high precision temperature control units CPL-$G_5$ and six post-exposure bake units PEB performing a heat treatment process with respect to the wafer W after exposure and before development are stacked in a ten-layer structure.

The high temperature heat treatment unit BAKE, the pre-bake unit PAB, the post-bake unit POST, and the post-exposure bake unit PEB formed in the third to fifth process unit groups $G_3$-$G_5$, for example, have the same structure and constitute a heat treatment unit.

Also, the number of stacked layers and the arrangement of units of the third to fifth process unit groups $G_3$-$G_5$ are not limited to the above descriptions.

In the sixth process unit group $G_6$, as illustrated in FIG. 41, from the bottom, two adhesion units AD and two heating units HP heating the wafer W are stacked in a four-layer structure. The adhesion unit AD may have a mechanism for controlling the temperature of the wafer W.

In the seventh process unit group $G_7$, as illustrated in FIG. 41, from the bottom, a layer thickness measurement unit FTI measuring the thickness of a resist layer and a periphery exposure unit WEE selectively exposing only the edge portion of the wafer W are stacked in a two-layer structure. The periphery exposure unit WEE may be arranged in a multi-layer structure.

A heat treatment unit such as the heating unit HP may be arranged at the rear side of the second main transfer unit $A_2$ as in the rear side of the first main transfer unit $A_2$.

The first main transfer unit $A_1$ includes a first main wafer transfer unit 116 that may selectively access each unit of the first, third, fourth, and sixth process unit groups $G_1$, $G_3$, $G_4$, and $G_6$.

The second main transfer unit $A_2$ includes a second main wafer transfer unit 117 that may selectively access each unit of the second, fourth, fifth, and seventh process unit groups $G_2$, $G_4$, $G_5$, and $G_7$.

Figure 42:
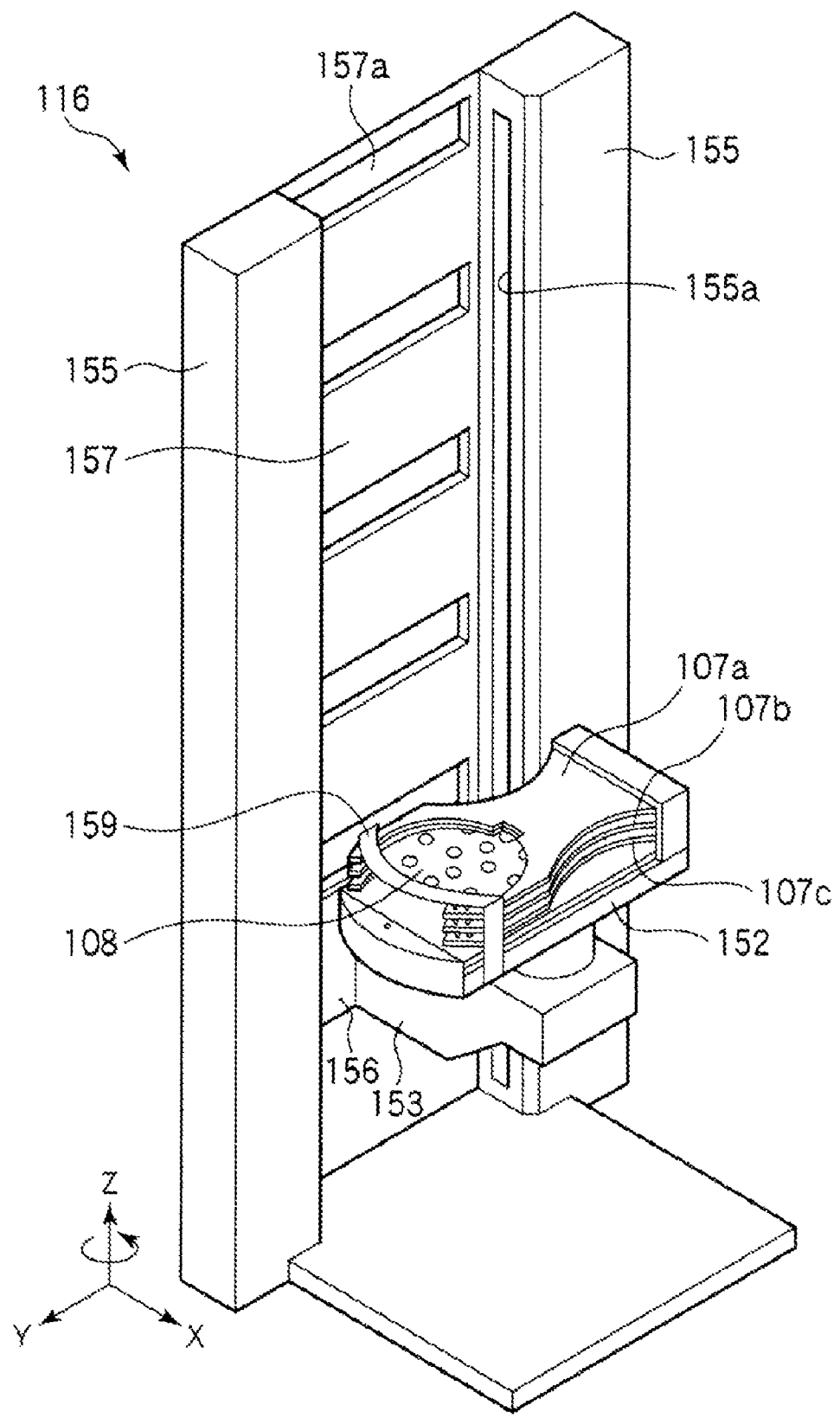
FIG. 42 is a perspective view schematically illustrating a main wafer transfer device included in the system for coating and developing resist of FIG. 39.

The first main wafer transfer unit 116, as illustrated in FIG. 42, includes three arms 107a, 107b, and 107c supporting the wafer W. The arms 107a, 107b, and 107c may move back and forth along a base plate 152. The base plate 152 is rotatably supported on a support unit 153 and rotated by a motor included in the support unit 153. The support unit 153 is movable up and down along a support column 155 extending in a vertical direction. A sleeve 155a is formed in the support column 155 in a vertical direction. A flange unit 156 laterally protruding from the support unit 153 is coupled to the sleeve 155a in order to be capable of sliding. The support unit 153 is moved up and down via the flange unit 156 by an elevation mechanism (not shown).

The arms 107a-107c of the first main wafer transfer unit 116 are movable in each of the directions X, Y, and Z and rotatable on a plane X-Y. Accordingly, as described above, the arms 107a-107c may access each unit of the first, third, fourth, and sixth process unit groups $G_1$, $G_3$, $G_4$, and $G_6$.

Also, a shield panel 108 is attached between the arm 107a and the arm 107b to shield radiation heat generated from the arms 107a and 107b. A sensor member 159 to which a light emitting device (not shown) is attached is formed above a tip end portion of the uppermost arm 107a. A light receiving device (not shown) is formed at a tip end of the base plate 152. An optical sensor including the light emitting device and the light receiving device may detect the existence and misalignment of the wafer W held by the arms 107a-107c.

Also, a wall unit 157 of the first main wafer transfer unit 116 illustrated in FIG. 42 is a part of a housing of the first main transfer unit $A_1$ located at the side of the first process unit group $G_1$. The wall unit 157 includes a window unit 157a for transferring the wafer W between the respective units of the first process unit group $G_1$.

The second main wafer transfer unit 117 has the same structure as the first main wafer transfer unit 116.

A liquid temperature control pump 124 and a duct 128 are formed between the first process unit group $G_1$ and the cassette station 111 while a liquid temperature control pump 125 and a duct 129 are formed between the second process unit group $G_2$ and the interface station 113. The liquid temperature control pumps 124 and 125 respectively supply a predetermined process liquid to the first and second process unit groups $G_1$ and $G_2$. Also, the ducts 128 and 129 supply clean air from an air conditioner (not shown) formed outside the resist coating and developing system 100 to the inside of each of the process unit groups $G_1$-$G_6$.

The first through seventh process unit groups $G_1$-$G_7$ may be detached from the resist coating and developing system 100 for the purpose of maintenance. A panel at the rear side of the process station 112 may also be detached or open/closed. Chemical units CHM 126 and 127 supplying the process liquid to the first and second process unit groups $G_1$ and $G_2$ are formed under the first and second process unit groups $G_1$ and $G_2$.

The interface station 113 includes a first interface station 113a at the side of the process station 112 and a second interface station 113b at the side of the exposure unit 114. A first wafer transfer unit 162 is arranged at the first interface station 113a to face an opening portion of the fifth process unit group $G_5$. A second wafer transfer unit 163 capable of moving in the direction X is arranged at the second interface station 113b.

An eighth process unit group $G_8$ is arranged at the rear side of the first wafer transfer unit 162, as illustrated in FIG. 41, and includes an out-buffer cassette OUTBR temporarily accommodating the wafer W removed from the exposure unit 114, an in-buffer cassette INBR temporarily accommodating the wafer W to be transferred to the exposure unit 114, and a periphery exposure unit WEE, which are stacked from the bottom. The in-buffer cassette INBR and the out-buffer cassette OUTBR may accommodate a plurality of wafers W, for example, twenty-five wafers W.

A ninth process unit group $G_9$ is arranged at the front side of the first wafer transfer unit 162, as illustrated in FIG. 40, and includes two layers of high precision temperature control units CPL-$G_9$ and a transition unit TRS-$G_9$, which are stacked from the bottom.

The first wafer transfer unit 162 may move in the direction Z and rotate in the direction θ. The first wafer transfer unit 162 includes a fork 162a for transferring wafers W in and out and which is capable of freely moving back and forth on the plane X-Y. The fork 162a may selectively access each unit of the fifth, eighth, and ninth process unit groups $G_5$, $G_8$, and $G_9$ and, accordingly, be capable of transferring the wafers W between the units.

The second wafer transfer unit 163 may move in the directions X and Z and rotate in the direction θ. The second wafer transfer unit 163 includes a fork 163a for transferring wafers W in and out and which is capable of freely moving back and forth on the plane X-Y. The fork 163a may selectively access each unit of the ninth process unit group $G_9$ and an in-stage 114a and an out-stage 114b of the exposure unit 114 and be capable of transferring the wafers W between the respective unit and elements.

Figure 43:
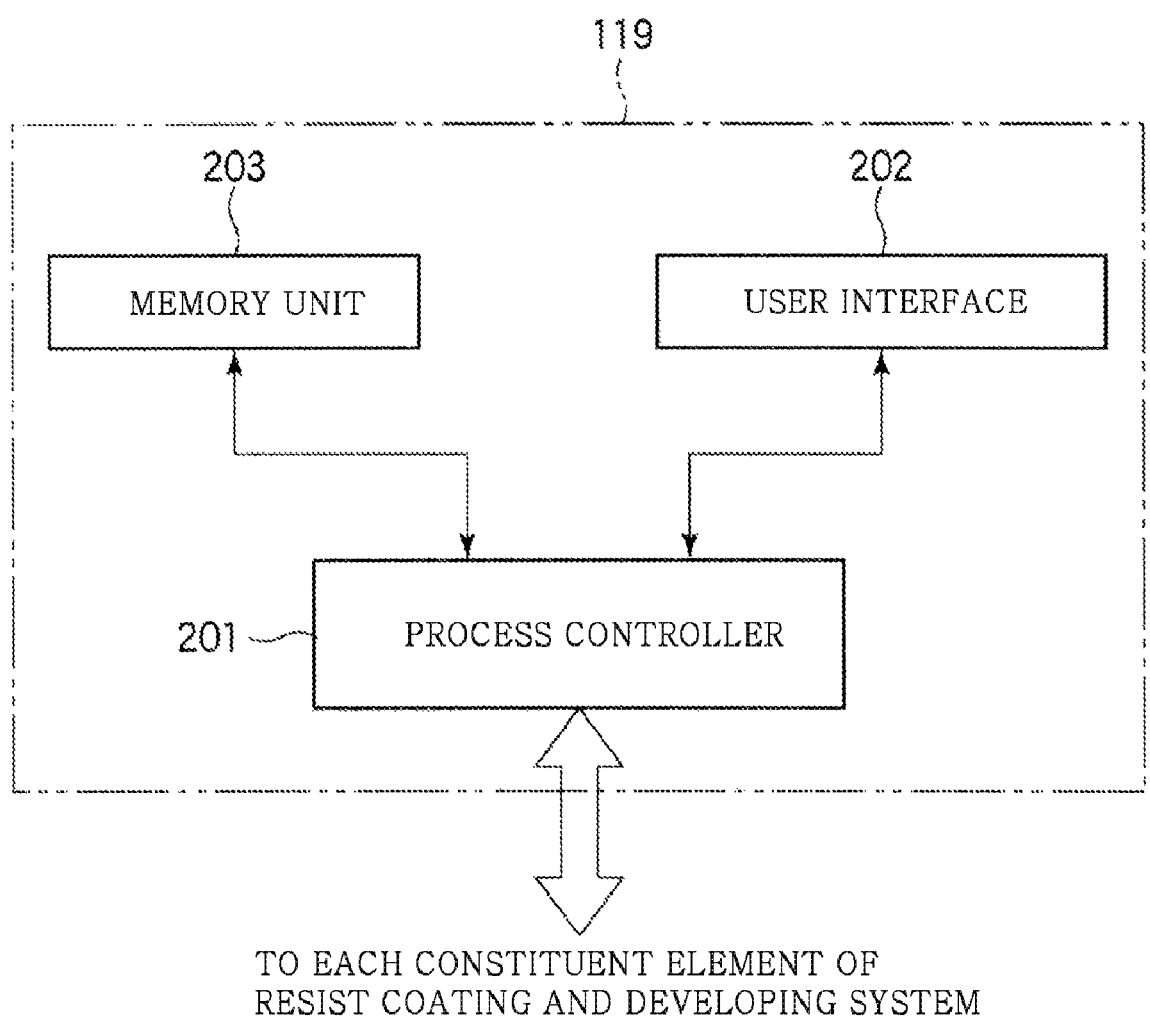
FIG. 43 is a block diagram illustrating a control system of the system for coating and developing resist of FIG. 39.

Referring to FIG. 40, a centralized control unit 119 controlling the overall operation of the resist coating and developing system 100 is formed under the cassette station 111. Referring to FIG. 43, the centralized control unit 119 includes a process controller 201 having a CPU and controlling constituent elements, such as each of the units and transfer mechanisms, of the resist coating and developing system 100. The centralized control unit 119 also includes a user interface 202 and a memory unit 203 which are connected to the process controller 201. The user interface 202 includes a keyboard performing command input operations of a process manager in order to manage the respective constituent elements of the resist coating and developing system 100 and a display visually displaying the operating state of each constituent element of the resist coating and developing system 100. The memory unit 203 stores a control program to execute various processes performed in the resist coating and developing system 100 under the control of the process controller 201 and a control program, such as a recipe or various databases, to execute a predetermined process for each constituent element of the resist coating and developing system 100. The recipe is stored in a memory medium in the memory unit 203. The memory medium may be a fixed memory device such as a hard disk, or a portable memory device such as a CD-ROM, DVD, or flash memory. Also, for example, the recipe may be appropriately transmitted from another device through a dedicated line. If necessary, according to instructions from the user interface 202, a recipe may be called from the memory unit 203 and executed in the process controller 201 so that a variety of desired processes may be performed in the resist coating and developing system 100 according to the control of the process controller 201.

For the above-described slimming a resist pattern using the resist coating and developing system 100 configured as above, the process described below might be performed.

The wafer transfer mechanism 121 picks up wafer Ws in a pre-treatment step, one by one, from the wafer cassette CR and transfers a wafer W to the transition unit TRS-$G_3$ arranged in the process unit group $G_3$ of the process station 112. The temperature control unit TCP performs a temperature control process on the wafer W. The bottom coating unit BARC belonging to the first process unit group $G_1$ forms an anti-reflection layer on the wafer W. The heating unit HP performs a heat treatment process on the wafer W. The high temperature heat treatment unit BAKE performs a bake process on the wafer W. The adhesion unit AD may perform an adhesion process on the wafer W before the bottom coating unit BARC forms an anti-reflection layer on the wafer W. The high precision temperature control unit CPL-$G_4$ performs a temperature control process on the wafer W. After the wafer W is transferred to the resist coating unit COT of the first process unit group $G_1$, a process of coating a resist solution on the wafer W is performed. Then, the pre-bake unit PAB of the fourth process unit group $G_4$ performs a pre-bake process on the wafer W. The periphery exposure unit WEE performs a periphery exposure process on the wafer W. The high precision temperature control unit CPL-$G_9$ performs a temperature control process on the wafer W. The second wafer transfer unit 163 transfers the wafer W to the inside of the exposure unit 114. The exposure unit 114 performs an exposure process on the wafer W. Then, the second wafer transfer unit 163 transfers the wafer W to the transition unit TRS-$G_9$. The first wafer transfer unit 162 transfers the wafer W to the post-exposure bake unit PEB of the fifth process unit group G5 where a post-exposure bake process is performed on the wafer W. The first wafer transfer unit 162 transfers the wafer W to a development unit DEV belonging to the second process unit group $G_2$ where a development process is performed on the wafer W. The post-bake unit POST performs a post-bake process on the wafer W. The high precision temperature control unit CPL-$G_3$ performs a temperature control process on the wafer W.

As a result, the above-described first development process is completed.

Next, the second development process (the removal of the intermediate exposed area) is performed. To this end, after the wafer W undergoes the first development process, the wafer W is put into the development unit DEV again and a development process, namely the second development process, is performed with respect to the wafer W. The development unit DEV used to perform the first development process may be used as the development unit DEV for performing the second development process. Otherwise, two types of development units DEVs may be prepared for the first and second development processes.

As described above, the second development process (the removal of intermediate exposed area) is completed.

Next, a new soluble layer is formed. To this end, after the wafer W undergoes the second development process, the wafer is put into the resist coating unit COT. In the resist coating unit COT, a solution including a reaction material, for example, an acid solution, may be coated on the wafer W instead of the resist solution. Aside from the resist coating unit COT coating the resist solution, a coating unit COT for coating an acid solution may be used.

As a result, the new soluble layer is completely formed.

Next, a third development process (the removal of the new soluble layer) is performed. To this end, the wafer W on which the new soluble layer is formed is put into the development unit DEV again and a development process, namely the third development process, is performed with respect to the wafer W. The development unit DEV used for the first and/or second development process, or a development unit DEV dedicated for a third development process may be used as the development unit DEV. After the development process is performed, a post-bake process is performed in the post-bake unit POST and a temperature control process is performed in the high precision temperature control unit CPL-$G_3$.

As a result, the third development process (the removal of the new soluble layer) is completed.

Then, the transition unit TRS-$G_3$ transfers the wafer W to a predetermined position of the wafer cassette CR of the cassette station 111.

Accordingly, the method of slimming a resist pattern according to the present embodiment may be performed in a single resist coating and developing system.

As described above, although several embodiments of the present invention are described above, the present invention is not limited thereto and a variety of modifications may be possible.

For example, although, in the third and fourth embodiments, the formation of a conductive polysilicon pattern is described as an example of the method of manufacturing a semiconductor device, the present invention is not applied only to the formation of a conductive polysilicon pattern and may be applied to, for example, the formation of a hole pattern as an interlayer insulation layer.

As described above, the present invention provides a method of slimming a resist pattern without collapsing the resist pattern, a method of manufacturing a semiconductor device using the slimming method, and a system for coating and developing resist for performing the slimming method.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing a semiconductor device, the method comprising:
   forming a resist layer on an underlayer;
   forming an exposed pattern in the resist layer, wherein the exposed pattern comprises a soluble layer and an insoluble layer;
   forming a first resist pattern by removing the soluble layer from the exposed pattern;
   removing an intermediate exposed area from the first resist pattern to form a second resist pattern;

applying a reaction material to the second resist pattern, the reaction material being a solubilization material that solubilizes the second resist pattern;

forming a new soluble layer in a surface of the second resist pattern where the reaction material is applied; and removing the new soluble layer from the second resist pattern to form a third resist pattern, the method further comprising:

removing a solubilizing component of the reaction material which solubilizes the second resist pattern, from an upper surface of the second resist pattern applied, after the applying of the reaction material to the second resist pattern, wherein the removing of the solubilizing component of the reaction material which solubilizes the second resist pattern comprises filling the second resist pattern with a filling material except for the upper surface of the second resist pattern, and then applying a material that removes the solubilizing component of the reaction material from the upper surface of the second resist pattern.

2. The method of claim 1, wherein the reaction material comprises acid, and resist material of the resist layer is chemically amplified resist that comprises a photoacid generator generating the acid and changes an alkali insoluble protection group of the resist layer to an alkali soluble group using the generated acid as a catalyst component.

3. The method of claim 1, wherein the removing of the intermediate exposed area is performed using a development process, wherein the temperature of a developer used in the development process is in a range of 23° C. to 70° C.

4. The method of claim 1, wherein the removing of the intermediate exposed area is performed using a development process, wherein the concentration of a developer used in the development process is in a range of 2.38% to 15%.

5. The method of claim 1, wherein the removing of the intermediate exposed area is performed using a development process, wherein the time of the development process is in a range of 1 second to 300 seconds.

6. The method of claim 1, wherein the removing of the new soluble layer from the second resist pattern is performed using a development process, wherein the temperature of a developer used in the development process is in a range of 23° C. to 70° C.

7. The method of claim 1, wherein the removing of the new soluble layer from the second resist pattern is performed using a development process, wherein the concentration of a developer used in the development process is in a range of 2.38% to 15%.

8. The method of claim 1, wherein the removing of the new soluble layer from the second resist pattern is performed using a development process, wherein the time of the development process is in a range of 1 second to 300 seconds.

9. The method of claim 1, wherein the material that removes the solubilizing component of the reaction material which solubilizes the second resist pattern comprises a neutralization material.

10. The method of claim 9, wherein the neutralization material is dispersed to the upper surface of the second resist pattern in a gas state.

11. The method of claim 1, further comprising:

forming a sidewall layer at a side surface of the third resist pattern; and removing the third resist pattern while leaving the sidewall layer.

12. The method of claim 11, further comprising:

etching the underlayer using the sidewall layer as an etching mask.

13. A method of manufacturing a semiconductor device, the method comprising:

forming a first resist layer on an underlayer;

forming a first exposed pattern in the first resist layer, wherein the first exposed pattern comprises a soluble layer and an insoluble layer;

forming a first resist pattern by removing the soluble layer from the first exposed pattern;

removing an intermediate exposed area from the first resist pattern to form a second resist pattern;

applying a reaction material to the second resist pattern, wherein the reaction material is a solubilization material that solubilizes the second resist pattern;

forming a new soluble layer in a surface of the second resist pattern where the reaction material is applied;

removing the new soluble layer from the second resist pattern to form a third resist pattern;

forming a second resist layer on the underlayer on which the third resist pattern after the new soluble layer is removed is formed;

forming a second exposed pattern in the second resist layer, wherein the second exposed pattern comprises a soluble layer and an insoluble layer;

forming a fourth resist pattern by removing the soluble layer from the second exposed pattern;

removing an intermediate exposed area from the fourth resist pattern to form a fifth resist pattern;

applying a reaction material to the fifth resist pattern, wherein the reaction material is a solubilization material that solubilizes the fifth resist pattern;

forming a new soluble layer in a surface of the fifth resist pattern where the reaction material is applied; and removing the new soluble layer from the fifth resist pattern to form a sixth resist pattern, the method further comprising:

removing a solubilizing component of the reaction material which solubilizes the second resist pattern, from an upper surface of the second resist pattern applied, after the applying of the reaction material to the second resist pattern, wherein the removing of the solubilizing component of the reaction material which solubilizes the second resist pattern comprises filling the second resist pattern with a filling material except for the upper surface of the second resist pattern, and then applying a material that removes the solubilizing component of the reaction material from the upper surface of the second resist pattern.

14. The method of claim 13, further comprising etching the underlayer using the third and sixth resist patterns after the new soluble layers are respectively formed, as etching masks.

15. The method of claim 13, further comprising:

forming a sidewall layer at sidewalls of the third and sixth resist patterns, after the new soluble layers are respectively removed; and removing the third and sixth resist patterns while leaving the sidewall layer.

16. The method of claim 15, further comprising etching the underlayer using the sidewall layer as an etching mask.

* * * * *